United States Patent
Tojima et al.

(10) Patent No.: US 6,556,505 B1
(45) Date of Patent: Apr. 29, 2003

(54) CLOCK PHASE ADJUSTMENT METHOD, AND INTEGRATED CIRCUIT AND DESIGN METHOD THEREFOR

(75) Inventors: Masayoshi Tojima, Kasuya-gun (JP); Hiromasa Nakajima, Machida (JP); Masahiro Oohashi, Kasuya-gun (JP); Yasuo Kohashi, Kasuya-gun (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/868,178

(22) PCT Filed: Dec. 15, 1999

(86) PCT No.: PCT/JP99/07043
§ 371 (c)(1),
(2), (4) Date: Jul. 12, 2001

(87) PCT Pub. No.: WO00/36512
PCT Pub. Date: Jun. 22, 2000

(30) Foreign Application Priority Data

Dec. 15, 1998 (JP) .............................................. 10-356550

(51) Int. Cl.$^7$ ................................................. G11C 8/00
(52) U.S. Cl. ..................................... 365/233; 365/194
(58) Field of Search ................................ 365/233, 194, 365/189.05, 189.07, 230.08

(56) References Cited

U.S. PATENT DOCUMENTS

| 5,467,040 A |   | 11/1995 | Nelson et al. ............... 327/276 |
| 5,646,904 A |   | 7/1997 | Ohno et al. .................. 365/233 |
| 5,828,871 A |   | 10/1998 | Kawaguchi et al. ......... 395/559 |
| 5,842,001 A |   | 11/1998 | Kubota ......................... 395/551 |
| 5,917,761 A | * | 6/1999 | Tietjen et al. ................ 365/233 |
| 6,222,792 B1 | * | 4/2001 | Hanzawa et al. ............ 365/233 |
| 6,240,495 B1 | * | 5/2001 | Usui ............................ 365/233 |
| 6,337,832 B1 | * | 1/2002 | Ooishi et al. ................ 365/233 |

FOREIGN PATENT DOCUMENTS

| JP | 04241675 | 8/1992 |
| JP | 06291615 | 10/1994 |
| JP | 07014927 | 1/1995 |
| JP | 07073118 | 3/1995 |
| JP | 09185427 | 7/1997 |

* cited by examiner

*Primary Examiner*—Trong Phan
(74) *Attorney, Agent, or Firm*—Parkhurst & Wendel, L.L.P.

(57) ABSTRACT

The time required for access to a SDRAM (110) is extracted from the layout of an integrated circuit (1000), a first phase difference between an external clock SDCLKO and an internal clock ICLK is calculated, and the value of delay of the external clock signal or the internal clock signal in the integrated circuit (1000) is changed on the basis of the calculated first phase difference, whereby clock phase adjustment for the integrated circuit (1000) in the designing stage is realized.

10 Claims, 13 Drawing Sheets

| PD (count value) | D | set value. (PSET) | error flag |
|---|---|---|---|
| 1 | D11 | 00001 | H |
| 2 | D12 | 00010 | L |
| 3 | D13 | 00100 | L |
| 4 | D14 | 01000 | L |
| 5 | D15 | 10000 | L |
| 6 | D16 | 10000 | H |

411-2  411-3  411-4  411-5

CLOCK PHASE ADJUSTMENT METHOD, AND INTEGRATED CIRCUIT AND DESIGN METHOD THEREFOR

TECHNOLOGICAL FIELD

The present invention relates to a clock phase adjustment method, and an integrated circuit and a method for designing the integrated circuit.

BACKGROUND ART

When writing data into a synchronous DRAM (Synchronous Dynamic Random Access Memory, hereinafter referred to as a SDRAM) or reading data from the SDRAM (hereinafter referred to as data access), it is difficult to make appropriate timing because of a high-speed operating clock. Therefore, conventionally, a LSI that makes data access to the SDRAM is fabricated initially, and then the phase of the clock is adjusted by trial and error.

Further, Japanese Published Patent Application No. Hei.9-185427 discloses a clock phase adjustment circuit and a clock phase adjustment method for making timing of access to a SDRAM.

FIG. 13 is a circuit diagram illustrating a memory interface circuit to which a clock phase adjustment circuit as disclosed in Japanese Published Patent Application No. Hei.9-185427 is applied. A memory interface device 700 comprises a clock frequency converter 710, two input buffers 711 and 720, a clock phase adjustment circuit 712, three output buffers 715, 717, and 719, and three flip-flops (FF) 716, 718, and 721. The interface device 700 outputs an external clock signal, a SDRAM command, and data to a SDRAM 702.

The clock phase adjustment circuit 712 is a circuit for adjusting the phase of a clock signal to execute appropriate data access to the SDRAM 702, and it inverts the phase of a clock signal as a reference of operation by 180 degrees, and outputs the clock signal to the SDRAM 702. The clock phase adjustment circuit 712 is composed of an inverter 713, a phase converter 714, and a selector 744.

The phase converter 714 is provided with clocks having different delay values. After the memory interface device 700 is connected to the SDRAM 702, operable clocks are tested by appropriate means, and a clock, which is judged as being appropriate on the basis of the result of the text, is selected.

The conventional clock phase adjustment is carried out by trial and error after fabricating an actual LSI. That is, since the design engineer adjusts the clock phase by repeating trial and error after the LSI is fabricated, the process steps relating to the fabrication of the LSI are complicated.

Further, in the interface device 700 as disclosed in Japanese Published Patent Application No. Hei.9-185427, a lot of delay elements relating to clock phase adjustment are required, whereby the circuit scale is increased, and the power consumption is also increased.

Further, since the data inputted to the interface device 700 passes through various circuits and buffers before it is outputted from the device 700, when the interface device 700 is implemented in a practical LSI, the delays of clocks might be greatly different from those expected, resulting in difficulty in determining the delay values of the delay elements. In this case, although determination of the delay values may be facilitated by preparing more delay clocks, this causes a new problem that the circuit scale and the power consumption are further increased.

Furthermore, since the delay values cannot be known unless the interface device 700 is actually connected to the SDRAM 702, it is necessary to perform, after connecting the interface circuit 700 to the SDRAM 702, a test of data transfer to select a clock of optimum delay value, whereby the number of process steps relating to the circuit fabrication increases.

Moreover, since external factors (wiring delay, external load, etc.) are not considered in the interface device 700, the precision is degraded. Further, in order to consider the external factors, a test of data transfer must be performed for every substrate to select a clock, whereby the number of process steps relating to the circuit fabrication increases.

The present invention provides a clock phase adjustment method that realizes clock phase adjustment in the designing stage, with reduced number of process steps relating to fabrication of a device that makes access to an external memory, without performing phase adjustment by trial and error, and without performing a test for clock phase adjustment. This clock phase adjustment method realizes supply of more reliable clocks, with minimum required circuits, even in perfect synchronous design, and realizes automatic clock phase adjustment even when a feedback clock system is employed.

Further, the present invention provides an integrated circuit and a design method thereof, which realize data access on the basis of a high-speed operating clock, without requiring complicated structure like the conventional circuit.

DISCLOSURE OF THE INVENTION

In order to achieve the above-mentioned objects, an integrated circuit according to the present invention has the following construction. That is, an integrated circuit, which makes data access to an external memory in synchronization with a clock, comprises: a clock generator for generating the clock; at least one first clock buffer for driving the clock as an external clock; at least one second clock buffer for driving the clock as an internal clock; a clock output buffer for outputting the external clock to the external memory; a data output flip-flop for outputting data to he outputted to the external memory, in synchronization with the internal clock; and an input flip-flop for capturing data outputted from the external memory, in synchronization with the internal clock; wherein a value of a phase difference D obtained by subtracting "the time from when the external clock is outputted from the clock generator to when it reaches the clock output buffer" from "the time from when the internal clock is outputted from the clock generator to when it reaches the data output flip-flop" is set so as to satisfy first to fourth conditions as follows: first condition: a first value obtained by subtracting "the time from when the external clock is outputted from the clock generator to when it reaches the external memory" from the sum of "the time from when the internal clock is outputted from the clock generator to when it reaches the data output flip-flop" and "the time from when data is outputted from the data output flip-flop by the internal clock that has reached there to when the data reaches the external memory" should be larger than the data hold time of the external memory; second condition: a value obtained by subtracting the first value from "the time corresponding to one cycle of the external clock" should be larger than the data setup time of the external memory; third condition: a value obtained by subtracting "the time from when the internal clock is outputted from the clock generator to when it reaches the input flip-flop" from the sum of "the time from when the external clock is outputted from the clock generator to when it reaches the external memory" and "the hold time of data to be outputted from the external memory on receipt of the external clock" and "the time from when the data is outputted to when it reaches the input flip-flop" should be larger than the data hold time of the input flip-flop; and fourth condition: a value obtained by subtracting the sum of "the time from when the external clock is outputted from the clock generator Lo when it reaches the external memory" and "the output delay time of data to be outputted from the external memory on receipt of the external clock" and "the time from when the data is outputted to when it reaches the input flip-flop" from the sum of "the time corresponding to one cycle of the internal clock" and "the time from when the internal clock is outputted from the clock generator to when it reaches the input flip-flop" should be larger than the data setup time of the input flip-flop.

Accordingly, the present invention can provide an integrated circuit that performs appropriate data transfer and clock supply, without having a complicated circuit like the conventional circuit in which plural delay elements are inserted in plural signal paths. Especially, the present invention facilitates design of an integrated circuit that requires high-speed access such as a SDRAM.

Furthermore, another integrated circuit according to the present invention, which makes data access to an external memory in synchronization with a clock, comprises: a clock generator for generating the clock from data; at least one first clock buffer for driving the clock as an external clock; at least one second clock buffer for driving the clock as an internal clock; a clock output buffer for outputting the external clock to the external memory; a data output flip-flop for outputting data to be outputted to the external memory, in synchronization with the internal clock; a first input flip-flop for latching the data outputted from the external memory, by a feedback clock of the external clock inputted to the external memory; and a second input flip-flop for latching the data latched by the first input flip-flop, by the internal clock; wherein a value of a phase difference D obtained by subtracting "the time from when the external clock is outputted from the clock generator to when it reaches the clock output buffer" from "the time from when the internal clock is outputted from the clock generator to when it reaches the data output flip-flop" is set so as to satisfy conditions as follows: a first value obtained by subtracting "the time from when the external clock is outputted from the clock generator to when it reaches the external memory" from the sum of "the time from when the internal clock is outputted from the clock generator to when it reaches the data output flip-flop" and "the time from when data is outputted from the data output flip-flop by the internal clock that has arrived, to when the data reaches the external memory" should be larger than the data hold time of the external memory; a value obtained by subtracting the first value from "the time corresponding to one cycle of the external clock" should be larger than the data setup time of the external memory; a value obtained by subtracting "the time from when the internal clock is outputted from the clock generator to when it reaches the second input flip-flop" from a value V obtained by summing "the time during which the external clock is outputted from the clock generator to reach the external memory, and turns back from the external memory as a feedback clock to reach the first input flip-flop" and "the cell delay of the first input flip-flop" and "the wiring delay from the first input flip-flop to the second input flip-flop" should be larger than the hold time of the second input flip-flop; a value obtained by subtracting the value V from the sum of "the time from when the internal clock is outputted from the clock generator to when it reaches the second input flip-flop" and "the time corresponding to one cycle of the external clock" should be larger than the setup time of the second input flip-flop; the value V should be larger than "the time from when the internal clock is outputted from the clock generator to when it reaches the second input flip-flop; and a value obtained by subtracting "the time from when the external clock is fed back from the external memory to when it reaches the first input flip-flop" from "the time from when data is outputted from the external memory to when it reaches the first input flip-flop" should be larger than the hold time of the first input flip-flop.

Accordingly, the present invention can provide an integrated circuit that makes access to the external memory using the feedback clock of the external clock.

The integrated circuit further comprises a phase difference detection circuit wherein plural sets of first phase differences and second phase differences are set in advance, the second phase difference being a phase difference between the point of time when the external clock is outputted from the integrated circuit and the point of time when the external clock reaches the integrated circuit by feedback from the external memory, and the first phase difference satisfying the above-mentioned conditions with respect to the second phase difference, and the phase difference detection circuit detecting an actual second phase difference after the integrated circuit is mounted on an arbitrary system, and then selecting a first phase difference corresponding to the detected result; and the first and/or second clock buffer is provided with delay elements corresponding to the respective first phase differences which have previously been set, and the delay elements are selected on the basis of the first phase difference selected by the phase difference detection circuit.

Since the integrated circuit is provided with the detector for detecting a phase difference between the external clock to be outputted to the external memory and the feedback clock from the external memory, the interface circuit can detect an actual delay and adjust the phase difference between the internal clock and the external clock. Further, even when there are various external factors, such as the wiring delay of a system on which the integrated circuit is mounted, the external load capacity, and the like, the optimum clock phase is adjusted.

The integrated circuit further comprises: as the input flip-flop, a first input flip-flop for latching the data outputted from the external memory, and a second input flip-flop for latching the data latched by the first input flip-flop; and as the second clock buffer, a clock buffer for supplying a first internal clock to the data output flip-flop and to the second input flip-flop, and a clock buffer for supplying a second internal clock to the first input flip-flop; wherein a value of a phase difference D0 obtained by subtracting "the time from when the external clock is outputted from the clock generator to when it reaches the external clock output buffer" from "the time from when the first internal clock is outputted from the clock generator to when it reaches the data output flip-flop" is set so as to satisfy the first and second conditions; and a phase difference D1 obtained by subtracting "the time from when the external clock is outputted from the clock generator to when it reaches the external clock output buffer" from "the time from when the second internal clock is outputted from the clock generator to when it reaches the first input flip-flop", which phase difference D1 satisfies the third and fourth conditions, is set so that a value obtained by subtracting "the delay of the data inputted to the first input flip-flop until it reaches the second input flip-flop" from a phase difference between the phase difference D0 and the phase difference D1 should be larger than the setup time of the second input flip-flop.

Accordingly, the present invention can provide an integrated circuit that constitutes a system for exchanging data at a higher speed clock, without having a complicated circuit in which plural delay buffers are inserted in plural positions like the conventional one. Especially, an integrated circuit having an interface circuit that requires high-speed access such as a SDRAM can easily be designed.

A clock phase adjustment method according to the present invention is used when an arbitrary device makes data access to an external memory in synchronization with a clock, and this method comprises: a step of extracting time parameters relating to transmission of signals in the device and transmission of signals between the device and the external memory, from the layout of the device when designing the device; a step of calculating, on the basis of the parameters, a first phase difference between the point of time when an external clock to be supplied to the external memory is outputted and the point of time when an internal clock for operating the device reaches a reference point of data input/output; a step of calculating, on the basis of the parameters, the range of the first phase difference which satisfies the condition that the external memory can capture data outputted from the device and the device can capture data outputted from the external memory; a step of judging whether the calculated first phase difference satisfies the calculated range of the first phase difference; a step of selecting an arbitrary first phase difference from the calculated range when it is judged in the judgement step that the calculated first phase difference does not satisfy the calculated range of the first phase difference: and a step of changing the value of delay of the external clock signal or the internal clock signal in the device, when designing the device, on the basis of the selected first phase difference.

Accordingly, when performing layout design of a device that makes access to an external memory using a clock, for example, when performing clock skew adjustment, the clock phase can be adjusted by changing the delay of the clock signal. Therefore, a circuit that can make reliable data access with an external memory is created without adjusting the clock phase by trial and error like the conventional one, and without performing a test for clock phase adjustment. Especially, even when high-speed access is required like a SDRAM, the present invention realizes easy and accurate phase adjustment between an external clock and an internal clock of a device capable of high-speed access. Further, since the circuit scale and the number of steps in circuit fabrication are reduced, the power consumption is reduced. Furthermore, since the design is easy, the time period for development is reduced, and automation is realized, whereby simple mistake in design is avoided.

Further, the first phase difference is a value obtained by subtracting "the time from when the external clock is outputted from a clock generator in the device to when it reaches an external clock output buffer in the device" from "the time from when the internal clock is outputted from the clock generator to when it reaches a data output flip-flop in the device; and in the step of calculating the range of the first phase difference, the range of the first phase difference that satisfies the following first to fourth conditions is calculated: first condition: a first value obtained by subtracting "the time from when the external clock is outputted from the clock generator to when it reached the external memory" from the sum of "the time from when the internal clock is outputted from the clock generator to when it reaches the data output flip-flop" and "the time from when data is outputted from the data output flip-flop by the internal clock to when the data reaches the external memory" should be larger than the data hold time that is required for the external memory to capture the data; second condition: a value obtained by subtracting the first value from "the time corresponding to one cycle of the external clock" should be larger than the data setup time that is required for the external memory Lo capture the data; third condition: a value obtained by subtracting "the time from when the internal clock is outputted from the clock generator to when it reaches the input flip-flop" from the sum of "the time from when the external clock is outputted from the clock generator to when it reaches the external memory" and "the hold time of data to he outputted from the external memory on receipt of the external clock" and "the time from when the data is outputted to when it reaches the input flip-flop in the device" should be larger than the data hold time of the input flip-flop; and fourth condition: a value obtained by subtracting the sum of "the time from when the external clock is outputted from the clock generator to when it reaches the external memory" and "the output delay time of data to be outputted from the external memory on receipt of the external clock" and "the time from when the data is outputted to when it reaches the input flip-flop" from the sum of "the time corresponding to one cycle of the internal clock" and "the time from when the internal clock is outputted from the clock generator to when it reaches the input flip-flop" should be larger than the data setup time of the input flip-flop.

Furthermore, the first phase difference is a value obtained by subtracting "the time from when the external clock is outputted from a clock generator in the device to when it reaches an external clock output buffer in the device" from "the time from when the internal clock is outputted from the clock generator to when it reaches a data output flip-flop in the device; data outputted from the external memory is latched into a first input flip-flop in the device by a clock that is the external clock inputted to the external memory and fed back to the device, and the latched data is latched into a second input flip-flip in the device by the internal clock; and in the process of calculating the range of the first phase difference, the range of the first phase difference that satisfies the following conditions is calculated: a first value obtained by subtracting "the time from when the external clock is outputted from the clock generator to when it reaches the external memory" from the sum of "the time from when the internal clock is outputted from the clock generator to when it reaches the data output flip-flop" and "the time from when data is outputted from the data output flip-flop by the internal clock to when the data reaches the external memory" should be larger than the data hold time that is required for the external memory to capture the data; a value obtained by subtracting the first value from "the time corresponding to one cycle of the external clock" should be larger than the data setup time that is required for the external memory to capture the data; a value obtained by subtracting "the time from when the internal clock is outputted from the clock generator to when it reaches the second input flip-flop" from a value V obtained by summing "the time during which the external clock is outputted from the clock generator to reach the external memory, and turns back from the external memory as a feedback clock to reach the first input flip-flop" and "the cell delay of the first input flip-flop" and "the wiring delay from the first input flip-flop to the second input flip-flop" should be larger than the hold time of the second input flip-flop; a value obtained by subtracting the value V from the sum of "the time from when the internal clock is outputted from the clock generator to when it reaches the second input flip-flop" and "the time corresponding to one cycle of the external clock" should be larger than the setup time of the second input flip-flop; the value V should be larger than "the time from when the internal clock is outputted from the clock generator to when it reaches the second input flip-flop; and a value obtained by subtracting "the time from when the external clock is fed back from the external memory to when it reaches the first input flip-flop" from "the time from when data is outputted from the external memory to when it reaches the first input flip-flop" should be larger than the hold time of the first input flip-flop.

Thereby, phase adjustment of a device that makes access to an external memory using a feedback clock can be performed when the device is designed.

Furthermore, another clock phase adjustment method according to the present invention is used when an arbitrary device makes data access to an external memory in synchronization with a clock, and this method comprises: a step of extracting time parameters relating to transmission of signals in the device and transmission of signals between the device and the external memory, from the layout of the device when designing the device; a step of calculating, on the basis of the parameters, the range of a first phase difference that is obtained by subtracting "the time from when the external clock is outputted from a clock generator in the device to when it reaches an external clock output buffer in the device" from "the time from when the internal clock is outputted from the clock generator to when it reaches a data output flip-flop in the device"; a step of arbitrarily setting a plurality of second phase differences between the point of time when the external clock is outputted from the device and the point of time when the external clock, which is fed back from the external memory, reaches the device; a step of setting a first phase difference from the calculated range, corresponding to each of the plural second phase differences; a step of detecting an actual second phase difference after the device is mounted on an arbitrary system; a step of comparing the detected result with the set second phase differences, and selecting the corresponding first phase difference; and a step of changing the value of delay of the external clock signal or the internal clock signal in a clock buffer in the device, on the basis of the selected first phase difference; wherein data outputted from the external memory is latched into a first input flip-flop in the device by a clock that is the external clock inputted to the external memory and fed back to the device, and the latched data is latched into a second input flip-flop by the internal clock; in the step of calculating the range of the first phase difference, the range of the first phase difference that satisfies the following conditions is calculated: a first value obtained by subtracting "the time from when the external clock is outputted from the clock generator to when it reaches the external memory" from the sum of "the time from when the internal clock is outputted from the clock generator to when it reaches the data output flip-flop" and "the time from when data is outputted from the data output flip-flop by the internal clock to when the data reaches the external memory" should he larger than the data hold time that is required for the external memory to capture the data; a value obtained by subtracting the first value from "the time corresponding to one cycle of the external clock" should be larger than the data setup time that is required for the external memory to capture the data; a value obtained by subtracting "the time from when the internal clock is outputted from the clock generator to when it reaches the second input flip-flop" from a value V obtained by summing "the time during which the external clock is outputted from the clock generator to reach the external memory, and turns back from the external memory as a feedback clock to reach the first input flip-flop" and "the cell delay of the first input flip-flop" and "the wiring delay from the first input flip-flop to the second input flip-flop" should be larger than the hold time of the second input flip-flop; a value obtained by subtracting the value V from the sum of "the time from when the internal clock is outputted from the clock generator to when it reaches the second input flip-flop" and "the time corresponding to one cycle of the external clock" should be larger than the setup time of the second input flip-flop; the value V should be larger than "the time from when the internal clock is outputted from the clock generator to when it reaches the second input flip-flop; and a value obtained by subtracting "the time from when the external clock is fed back from the external memory to when it reaches the first input flip-flop" from "the time from when data is outputted from the external memory to when it reaches the first input flip-flop" should be larger than the hold time of the first input flip-flop.

That is, it is possible to design a device that detects the phase difference between an external clock to be outputted to an external memory and a feedback clock from the external memory, and adaptively adjusts the phase difference between the internal clock and the external clock. Accordingly, even when there are various external factors such as the wiring delay of a system on which the device is mounted, the external load capacity, and the like, an optimum clock phase can be set.

Furthermore, the above-described device is provided with, as the input flip-flop, a first input flip-flop that latches the data outputted from the external memory, and a second input flip-flop that latches the data latched by the first input flip-flop; the clock generator generates a first internal clock to be supplied to the date output flip-flop and the second input flip-flop, and a second internal clock to be supplied to the first input flip-flop; the first phase difference includes a phase difference D0 obtained by subtracting "the time from when the external clock is outputted from the clock generator to when it reaches the external clock output buffer" from "the time from when the first internal clock is outputted from the clock generator to when it reaches the data output flip-flop", and a phase difference D1 obtained by subtracting "the time from when the external clock is outputted from the clock generator to when it reaches the external clock output butter" from "the time from when the second internal clock is outputted from the clock generator to when it reaches the first input flip-flop"; the step of calculating the range of the first phase difference calculates the range of the phase difference D0 that satisfies the first and second conditions, and the range of the first phase difference D1 that satisfies the third and fourth conditions, and calculates the ranges of the phase differences D0 and D1 which satisfy the condition that a value obtained by subtracting "the delay of the data inputted to the first input flip-flop until it reaches the second input flip-flop" from the phase difference between the phase differences D0 and D1 should be larger than the setup time of the second input flip-flop; and the step of changing the value of delay of the clock signal changes the value of delay of the external clock or the internal clock in the device, on the basis of the phase difference between the selected phase differences D0 and D1.

Accordingly, the phase of a device that makes access to an external memory using a higher speed click can be adjusted. Especially, this method is effective when high-speed access like a SDRAM is required.

Furthermore, an integrated circuit design method according to the present invention is a method for designing an integrated circuit that makes data access to an external memory in synchronization with a clock, and the integrated circuit comprises: a clock generator for generating an internal clock and an external clock; a data output flip-flop for latching the data to be outputted to the external memory; a first input flip-flop for latching the data outputted from the external memory, by a feedback clock of the external clock inputted to the external memory; a second input flip-flop for latching the data latched by the first input flip-flop, by the internal clock; a phase difference detection circuit wherein plural sets of first phase differences and second phase differences are set in advance, the first phase difference being a phase difference obtained by subtracting "the time from when the external clock is outputted from the clock generator in the integrated circuit to when it reaches an external clock output buffer in the integrated circuit" from "the time from when the internal clock is outputted from the clock generator to when it reaches a data output flip-flop in the integrated circuit", and the second phase difference being a phase difference between the point of time when the external clock is outputted from the integrated circuit and the point of time when the external clock reaches the integrated circuit by feedback from the external memory, and the phase difference detection circuit detecting an actual second phase difference after the integrated circuit is mounted on an arbitrary system, and then selecting a first phase difference corresponding to the detected result; and a clock buffer including delay elements corresponding to the respective first phase differences that have previously been set, and selecting the delay elements on the basis of the first phase difference selected by the phase error detection circuit; and the design method comprises: a step of extracting time parameters relating to transmission of signals in the device and transmission of signals between the device and the external memory, from the layout of the device when designing the device; a step of calculating, on the basis of the parameters, the range of the first phase difference that satisfy the following conditions: a first value obtained by subtracting "the time from when the external clock is outputted from the clock generator to when it reaches the external memory" from the sum of "the time from when the internal clock is outputted from the clock generator to when it reaches the data output flip-flop" and "the time from when data is outputted from the data output flip-flop by the internal clock to when the data reaches the external memory" should be larger than the data hold time that is required for the external memory to capture the data; a value obtained by subtracting the first value from "the time corresponding to one cycle of the external clock" should be larger than the data setup time that is required for the external memory to capture the data; a value obtained by subtracting "the time from when the internal clock is outputted from the clock generator to when it reaches the second input flip-flop" from a value V obtained by summing "the time during which the external clock is outputted from the clock generator to reach the external memory, and turns back from the external memory as a feedback clock to reach the first input flip-flop" and "the cell delay of the first input flip-flop" and "the wiring delay from the first input flip-flop to the second input flip-flop" should be larger than the hold time of the second input flip-flop; a value obtained by subtracting the value V from the sum of "the time from when the internal clock is outputted from the clock generator to when it reaches the second input flip-flop" and "the time corresponding to one cycle of the external clock" should be larger than the setup time of the second input flip-flop; the value V should be larger than "the time from when the internal clock is outputted from the clock generator to when it reaches the second input flip-flop; and a value obtained by subtracting "the time from when the external clock is fed back from the external memory to when it reaches the first input flip-flop" from "the time from when data is outputted from the external memory to when it reaches the first input flip-flop" should be larger than the hold time of the first input flip-flop; and a step of arbitrarily setting a plurality of second phase differences; a step of setting a first phase difference that satisfies the above conditions, corresponding to each of the plural second phase differences; and a step of setting the value of delay of the external clock or the internal clock in the integrated circuit, corresponding to each of the calculated first phase differences.

That is, it is possible to design an integrated circuit that detects the phase difference between an external clock to be outputted to an external memory and a feedback clock from the external memory, and automatically adjusts the phase difference between the internal clock and the external clock, after the integrated circuit is mounted. Accordingly, even when there are various external factors such as the wiring delay of a system on which the device is mounted, the external load capacity, and the like, an optimum clock phase can be adjusted.

BRIEF DESCRIPTION OF THE DRAWINGS

FIG. 6 is an example of a table possessed by a phase difference detector 411.

BEST MODE TO EXECUTE THE INVENTION

Hereinafter, a clock phase adjustment method, an integrated circuit, and a method for designing the integrated according to the present invention will be described with reference to the drawings.

Embodiment 1

Figure 1:
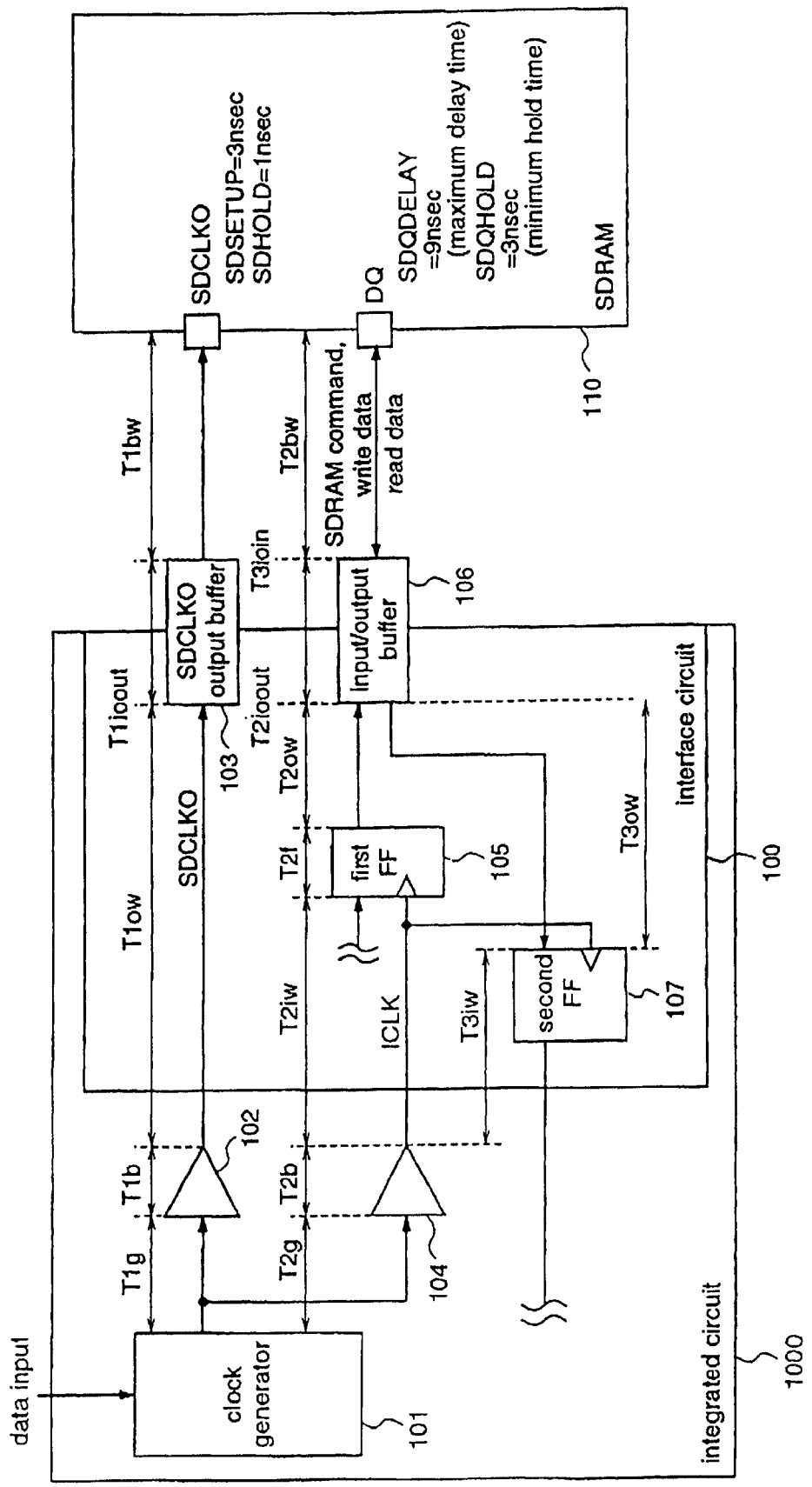
FIG. 1 is a block diagram illustrating the circuit structure of an integrated circuit 1000 that is fabricated using a clock phase adjustment method according to a first embodiment.

FIG. 1 is a block diagram illustrating a part of the structure of an integrated circuit 1000 that is provided with an interface circuit 100 for making data access to an external memory, i.e., a SDRAM 110, which integrated circuit 1000 is fabricated using a clock phase adjustment method according to a first embodiment of the invention. In FIG. 1, for the sake of simplicity, only the constituents relating to access to the SDRAM 110, among the constituents of the integrated circuit 1000, are schematically shown.

The integrated circuit 1000 comprises a clock generator 101, a first clock buffer 102, a second clock buffer 104, and an interface circuit 100. The interface circuit 100 comprises a SDCLKO output buffer 103, a first flip-flop (first FF) 105 as an output flip-flop, an input/output buffer 106, and a second flip-flop (second FF) 107 as an input flip-flop. In the figure, arrows accompanied with parameters starting with T indicate delay parameters relating to transmission of signals in the integrated circuit 1000 and transmission of signals between the integrated circuit 1000 and the SDRAM 110, which delay parameters will be described later.

The clock generator 101 generates a reference clock from, for example, a sync signal supplied from the outside, or a sync signal included in data supplied from the outside, or an oscillator provided inside.

The first clock buffer 102 drives the reference clock, and outputs an external clock SDCLKO to be supplied to the SDRAM 110, to the SDCLKO output butter 103.

The SDCLKO output buffer 103 drives the SDCLKO, and outputs it to the SDRAM 110. The SDRAM 110 operates in synchronization with the SDCLKO.

The second clock buffer 104 drives the reference clock, generates an internal clock ICLK to operate the inside of the integrated circuit 1000, and supplies the ICLK to the respective constituents of the integrated circuit 1000. FIG. 1 shows the case where the ICLK is outputted to the first FF 105 and the second FF 107, for the sake of simplicity.

The data to be outputted to the SDRAM 110 is latched into the first FF 105, and the first FF 105 outputs the latched data, in synchronization with the ICLK, through the input/output buffer 106 to the SDRAM 110. The data to be outputted to the SDRAM 110 includes signals to control the SDRAM 110, such as a SDRAM command, write data, and the like, and usually an output flip-flop is provided for each kind of data. However, since the flip-flops relating to the data output are fundamentally identical, the output flip-flops are represented by the first FF 105 in this first embodiment, for the sake of simplicity. Accordingly, actually the output flip-flops can be provided corresponding to the respective kinds of data. Further, the above-mentioned data are supplied from arbitrary circuits to the first FF 105.

On the other hand, when the data stored in the SDRAM 110 is read according to the SDRAM command, the second FF 107 latches the read data through the input/output buffer 106.

The integrated circuit 1000 shown in FIG. 1 is designed according to a clock phase adjustment method that will be later described. That is, when the integrated circuit 1000 is designed, time parameters, i.e., delay parameters, relating to transmission of signals inside the integrated circuit 1000 and transmission of signals between the transmission circuit 1000 and the SDRAM 110 are extracted from the layout of the integrated circuit 1000, and the extracted delay parameters are merged to a first phase difference between the SDCLKO and the ICLK so that data reception/transmission can be performed reliably, and the phase difference is changed, thereby providing an integrated circuit in which the SDRAM 110 captures the data and the control signal by the SDCLKO through the interface circuit 100, and the interface circuit 100 latches the data outputted from the SDRAM 110 by the internal clock ICLK. Therefore, according to the first embodiment, clocks of phases having high operation reliability can be easily obtained without using a special circuit for clock phase adjustment like the conventional clock phase adjustment.

Figure 2:
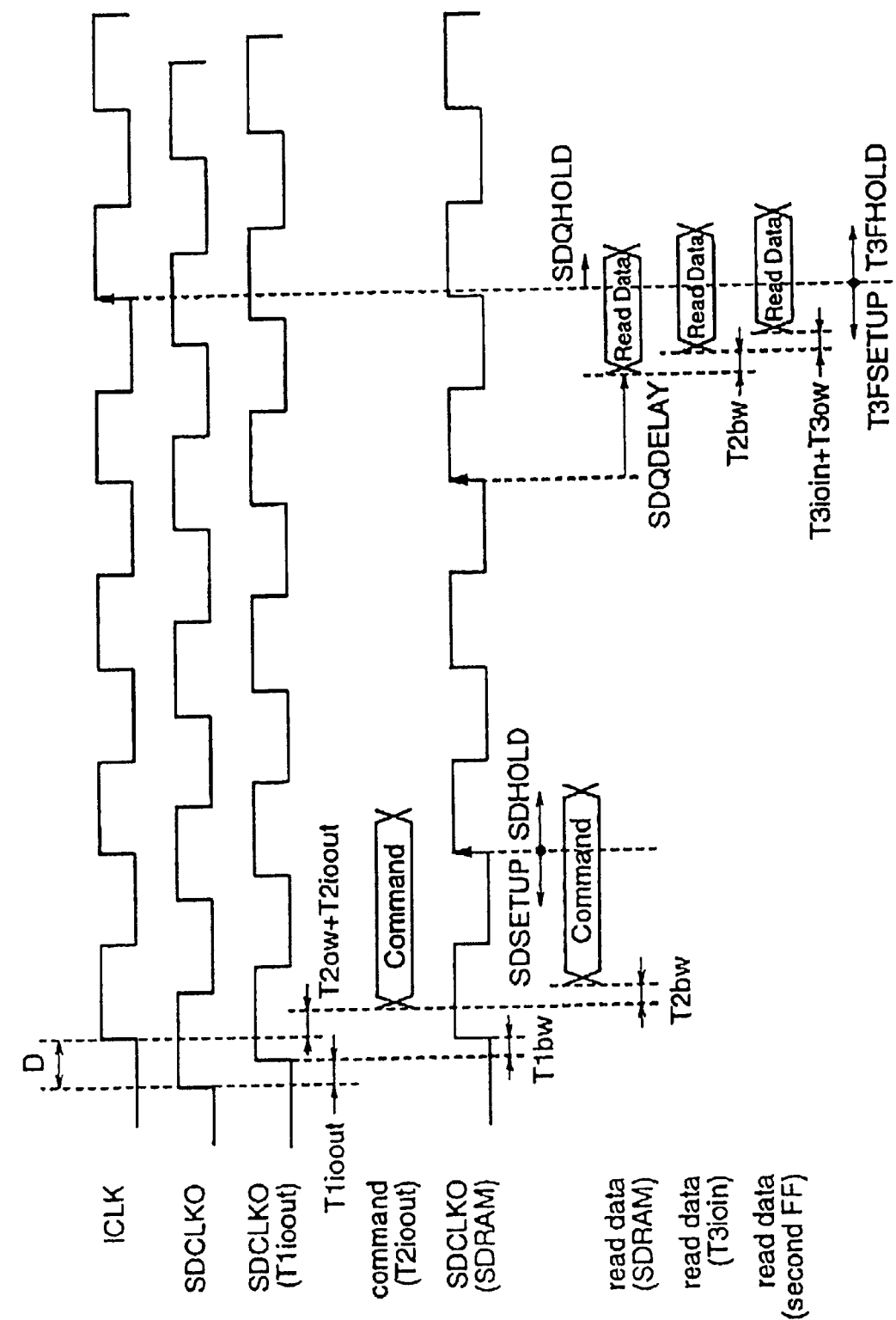
FIG. 2 is a timing chart illustrating the relationship in phases between clocks and data.

FIG. 2 is a timing chart showing the relationship in phases between clocks and data. The relationship in phases between clocks and data will be described with reference to FIGS. 1 and 2.

Initially, the SDCLKO signal inputted to the SDCLKO output buffer 103 is outputted from the SDCLKO output buffer 103 after a period of time represented by T1$io$out. The T1$io$out indicates a time required for the SDCLKO output buffer 103 to output the signal, i.e., an output delay.

Subsequently, the SDCLKO reaches the SDRAM 110 after a period of time represented by T1$bw$. The T1$bw$ indicates a wiring delay from the SDCLKO output buffer 103 to the SDRAM 110.

Subsequently, the ICLK reaches the first FF 105 with a delay of D from when the SDCLKO has reached the SDCLKO output buffer 103. This D indicates a phase difference at the time when the internal clock ICLK has reached the first FF 105, with respect to the time when the SDCLKO has been inputted to the SDCLKO output buffer 103.

Subsequently, the command reaches the SDRAM 110 after a period of time represented by T2$bw$. The T2$bw$ indicates a wiring delay from the input/output buffer 106 to the SDRAM 110.

In the figure, a period of time represented by SDSETUP is the setup time to be secured for data access, before rising of the SDCLKO in the SDRAM 110. A period of time represented by SDHOLD is the data hold time to be secured for data access, after rising of the SDCLKO in the SDRAM 110.

On the other hand, when reading data from the SDRAM 110, the data is read out after a period of time represented by SDQDELAY from when the SDCLKO has reached the SDRAM 110.

SDSETUP (setup time to be secured for data access, before rising of SDCLKO in SDRAM)=3 nsec; SDHOLD (data hold time to be secured for data access, after rising of SDCLKO in SDRAM)=1 nsec; SDQDELAY (delay time of data DQ outputted from SDRAM)=9 nsec; SDQHOLD (hold time of data DQ outputted from SDRAM)=3 nsec, as shown in Table 1 and FIGS. 1, 9 and 11.

Figure 13:
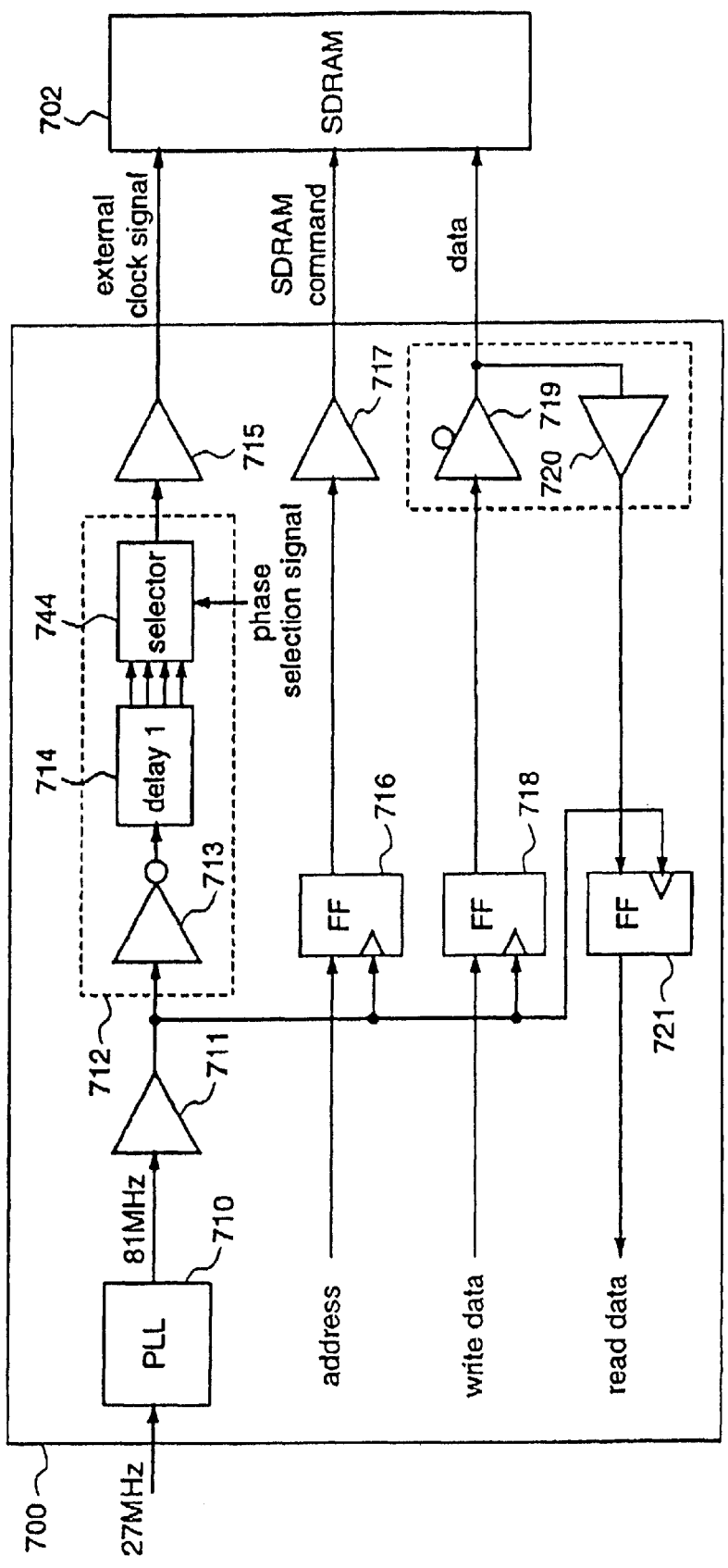
FIG. 13 is a diagram illustrating an interface circuit as disclosed in Japanese Published Patent Application. No. Hei.9-185427.

FIG. 13 shows flip-flop 716 for receiving an "address" signal, flip-flop 718 for receiving a "write data" signal, and flip-flop 721 for receiving a "read" signal. A "phase selection signal" applied to selector 744 performs designation for selecting a predetermined delay value from plural delay values.

The read data is inputted to the input/output buffer 106 after a period of time represented by T2$bw$.

The data inputted to the input/output buffer 106 reaches the second FF after a period of time represented by T3$ow$+T3$io$in. The T3$ow$ indicates the wiring delay from the input/output buffer 106 to the second FF 107, and the T3$io$in indicates the buffer delay of the input/output buffer 106.

In FIG. 2, the hold time of the data DQ outputted from the SDRAM 110 is represented by SDQHOLD, and the setup time and the hold time required for the data input into the second FF 107 are represented by T3FSETUP and T3FHOLD, respectively.

Next, a description will be given of a method for calculating a clock phase difference D that is important in the clock phase adjustment method for the data transfer circuit, with reference to FIGS. 1 and 2.

Initially, a circuit as shown in FIG. 1 is designed, and layout and wiring are carried out using layout tools. Base on the result, delay parameters relating to the respective constituents (cells) and wiring are extracted, and a phase difference D between the SDRAM clock SDCLKO and the internal clock ICLK is calculated using the following formula.

Using the delay parameters extracted from the layout of the circuit shown in FIG. 1, a phase difference D represented by formula (1) is obtained by the method described later.

The phase difference D is a difference in phases between the point of time when the external clock to be supplied to the external memory is outputted, and the point of time when the internal clock that operates the integrated circuit reaches the reference point of data input/output, i.e., the phase difference D is a value obtained by subtracting "the time from when the external clock is outputted from the clock generator to when it reaches the external clock output buffer" from "the time from when the internal clock is outputted from the clock generator to when it reaches the data output flip-flop", and this value is represented by formula (1).

$$D = (T2g + T2b + T2iw) - (T1g + T1b + T1ow) \quad (1)$$

wherein T2$g$ indicates the wiring delay from the clock generator 101 to the second clock buffer 104, T2$b$ indicates the cell delay in the second clock buffer 104, T2$iw$ indicates the wiring delay from the second clock buffer 104 to the first FF 105, T1$g$ indicates the wiring delay from the clock generator 101 to the first clock buffer 102, T1$b$ indicates the cell delay in the first clock buffer 102, and T1$ow$ indicates the wiring delay from the first clock buffer 102 to the SDCLKO output buffer 103.

The first essential condition for fabricating an integrated circuit provided with an interface circuit that makes data access to an external memory such as a SDRAM, is that the SDRAM can capture the data (including the SDRAM command and the write data) outputted from the integrated circuit.

In order to satisfy this condition, the following conditions should be satisfied.

Condition 1: A first value obtained by subtracting "the time from when the external clock is outputted from the clock generator to when it reaches the external memory" from the sum of "the time from when the internal clock is outputted from the clock generator to when it reaches the output flip-flop" and "the time from when data is outputted from the output flip-flop by the internal clock to when the data reaches the external memory" should be larger than the data hold time that is required for the external memory to capture the data.

Condition 2: A value obtained by subtracting the first value from a period of time corresponding to one cycle of the external clock, should be larger than the data setup time that is required for the external memory to capture the data.

In this first embodiment, the clock generator 101 generates the SDCLKO and the ICLK and the first FF 105 outputs the data to the SDRAM 110 by the ICLK and, therefore, the first value translates into a value obtained by subtracting "the time from when the SDCLKO is outputted from the clock generator 101 to when it reaches the SDRAM 110" from the sum of "the time from when the ICLK is outputted from the clock generator 101 to when it reaches the first FF 105" and "the time from when data is outputted from the first FF 105 by the ICLK to when it reaches the SDRAM 110".

With reference to FIGS. 1 and 2, the reach time CKD of the SDCLKO clock from the clock generator 101 to the SDRAM 110 is obtained by formula (2).

$$CKD = (T1g + T1b + T1ow + T1ioout + T1bw) \quad (2)$$

Furthermore, the reach time DQOV of the data outputted from the integrated circuit 1000 to the SDRAM 110 (hereinafter, the data and command to be inputted to the SDRAM 110 are collectively referred to as DQ) is represented by formula (3) when it is considered from the point of time when the ICLK is outputted from the clock generator 101.

$$DQOD = (T2g + T2b + T2iw + T2f + T2ow + T2ioout + T2bw) \quad (3)$$

wherein T2$f$ indicates the cell delay in the first FF 105.

Further, T1$bw$ and T2$bw$ are delay value data calculated from the board layout, and these may be request delay values.

When condition 1 is represented using the above-mentioned codes, formula (4) is obtained.

$$SDHOLD < DQOD - CKD \quad (4)$$

Further, when the time corresponding to one cycle of the clock to be supplied to the SDRAM 110 is represented by SDCLKCYCLE and condition 2 is represented using the above-mentioned codes, formula (5) is obtained.

$$SDSETUP < SDCLKCYCLE - (DQOD - CKD) \quad (5)$$

From formulae (1) to (5), $$SDHOLD - (T2f + T2ow + T2ioout + T2bw - T1ioout - T1bw) < D < SDCLKCYCLE - SDSETUP - (T2f + T2ow + T2ioout + T2bw - T1ioout - T1bw) \quad (6)$$

Furthermore, a second essential condition for fabricating the integrated circuit provided with the interface circuit that makes access to the external memory such as a SDRAM, is that the integrated circuit can capture the data outputted from the SDRAM. In order to satisfy this condition, the following conditions 3 and 4 should be satisfied.

Condition 3: A second value obtained by subtracting "the time from when the internal clock is outputted from the clock generator to when it reaches the input flip-flop", from the sum of "the time from when the external clock is outputted from the clock generator to when it reaches the external memory" and "the hold time of the data to be outputted from the external memory on receipt of the external clock" and "the time required for the outputted data to reach the input flip-flop", should be larger than the data input hold time of the input flip-flop.

Condition 4: A third value obtained by subtracting the sum of "the time from when the external clock is outputted from the clock generator to when it reaches the external memory" and "the output delay time of the data to be outputted from the external memory on receipt of the external clock" and "the time required for the outputted data to reach the input flip-flop inside the integrated circuit", from the sum of "the time corresponding to one cycle of the internal clock" and "the time from when the internal clock is outputted from the clock generator to when it reaches the input flip-flop" should be larger than the data input setup time of the input flip-flop.

In this first embodiment, since the clock generator 101 generates the SDCLKO and the ICLK and the second FF 107 captures the data outputted from the SDRAM 110, the second value translates into a value obtained by subtracting "the time from when the ICLK is outputted from the clock generator 101 to when it reaches the second FF 107" from the sum of "the time from when the SDCLKO is outputted from the clock generator 101 to when it reaches the SDRAM 110" and "the hold time of the data to be outputted from the SDRAM 110 on receipt of the SDCLKO" and "the time required for the outputted data to reach the second FF 107".

Further, the third value translates into a value obtained by subtracting the sum of "the time from when the SDCLKO is outputted from the clock generator to when it reaches the SDRAM 110" and "the output delay time of the data to be outputted from the SDRAM 110 on receipt of the SDCLKO" and "the time required for the outputted data to reach the second FF107", from the sum of "the time corresponding to one cycle of the ICLK" and "the time from when the ICLK is outputted from the clock generator to when it reaches the second FF 107".

The second FF 107 operates on the internal clock ICLK of the integrated circuit 1000. With reference to FIGS. 1 and 2, the time DQID required for the output data DQ from the SDRAM 110 to reach the second FF 107 is represented by formula (7).

$$DQID = T2bw + T3ioin + T3ow \qquad (7)$$

Further, the time MCKD required for the operating clock ICLK in the integrated circuit 1000 to reach the second FF 107 is represented by formula (8), considering that $T3iw \approx T2iw$ from the result of clock skew adjustment.

$$MCKD = T2g + T2b + T2iw \qquad (8)$$

Accordingly, condition 3 is represented by $$T3FHOLD < (CKD + SDQHOLD + DQID) - MCKD \qquad (9)$$

Further, condition 4 is represented by $$T3FSETUP < SDCLKCYCLE + MCKD - (CKD + SDQDELAY + DQID) \qquad (10)$$

Since the SDCLKO and the ICLK are generated by the clock generator 101, these clocks have the same period of time corresponding to one cycle.

From formulae (1), (2), (7)–(10), the following relationship holds:

$$(T1ioout + T1bw + T2bw + T3ioin + T3ow) + SDQDELAY - SDCLKCYCLE + T3FSETUP < D < (T1ioout + T1bw + T2bw + T3ioin + T3ow) + SDQHOLD - T3FHOLD \qquad (11)$$

The phase difference D is calculated by substituting the respective layout-extracted parameters in formula (6) and formula (11). Since, usually, there are those parameters in MAXIMUM condition and MINIMUM condition, the phase difference D satisfying both conditions is calculated.

For example, it is now assumed that there is a maximum external load capacity of 10 pF on the external pin, and the parameters extracted after layout are as shown in Table 1 and Table 2 in the MAXIMUM condition and the MINIMUM condition, respectively.

TABLE 1

| | unit: nsec |
|---|---|
| CLOCKCYCLE | 14.8 |
| SDSETUP | 3 |
| SDHOLD | 1 |
| SDQDELAY | 9 |
| SDQHOLD | 3 |
| T2f | 1.36 |
| T3ow | 2.27 |
| T2ow | 1.58 |
| T1ioout | 7.33 |
| T2ioout | 7.79 |
| T3ioin | 1.4 |
| T3FHOLD | 0 |
| T3FSETUP | 0.89 |
| T1bw | 0.105 |
| T2bw | 0.233 |

TABLE 2

| | unit: nsec |
|---|---|
| CLOCKCYCLE | 14.8 |
| SDSETUP | 3 |
| SDHOLD | 1 |
| SDQDELAY | 9 |
| SDQHOLD | 3 |
| T2f | 0.17 |
| T3ow | 0 |
| T2ow | 0 |
| T1ioout | 1.23 |
| T2ioout | 1.24 |
| T3ioin | 0.17 |
| T3FHOLD | 0 |
| T3FSETUP | 0.41 |
| T1bw | 0.105 |
| T2bw | 0.099 |

The MAXIMUM condition is that the voltage is 0.92× VDD and the temperature is 70° C., and the MINIMUM condition is that the voltage is 1.08×VDD and the temperature is 0° C. The VDD is the operating voltage of the integrated circuit.

Under the MAXIMUM condition, calculation is carried out on assumption that the phase difference D is about twice what it is at the TYPICAL time, from Table 1, using formula (6), $$-3.218 \text{ nsec} < 2D < 7.582 \text{ nsec}$$

and, from Table 1, using formula (11), $$5.738 \text{ nsec} < 2D < 13.648 \text{ nsec}$$

Accordingly, the phase difference D should be in the following range.

$$2.869 \text{ nsec} < D < 3.79 \text{ nsec} \qquad (12)$$

Under the MINIMUM condition, calculation is carried out on assumption that the phase difference D is about half what it is in the TYPCAL time, from Table 2, using formula (6), $$0.826 \text{ nsec} < D/2 < 11.626 \text{ nsec}$$

and, from Table 2, using formula (11), $$-3.786 \text{ nsec} < D/2 < 4.604 \text{ nsec}$$

Accordingly, the phase difference D should be in the following range.

$$1.656 \text{ nsec} < D < 9.208 \text{ nsec} \qquad (13)$$

Further, assuming that the minimum value of the external load is 3 pF, the parameters are extracted after the layout (result of extraction is not displayed), and the phase difference D is calculated using formulae (6) and (11) in like manner as the calculation with the external load of 10 pF to obtain the results of formulae (14) and (16), respectively, $$1.839 \text{ nsec} < D < 3.926 \text{ nsec} \qquad (14)$$

$$1.652 \text{ nsec} < D < 8.508 \text{ nsec} \qquad (15)$$

and, the medium value is taken from formulae (12) to (15), resulting in D≈3.4 nse.

The clock phase can be adjusted in the LSI designing stage by using the clock phase adjustment method in which, after creating the layout of the integrated circuit 1000, the phase difference D is calculated using the extracted parameters and the above-mentioned formulae and then a clock tree is constructed by changing the phase difference so that the internal clock ICLK of the integrated circuit 1000 is delayed by the value of D (in the above case, 3.4 nsec) from the clock SDCLKO to be supplied to the SDRAM 110. At this time, the value of (T1$g$+T1$b$+T1$ow$) considering the phase difference D selected by the above method is set in the first clock buffer 102, and the value of (T2$g$+T2$b$+T2$iw$) considering the phase difference D is set in the second clock buffer 104.

The delay elements are adjusted by, for example, adjusting the delay elements in the path of the SDCLKO when performing clock skew adjustment which is usually performed on the clock tree structure, to change the phase of the SDCLKO to the phase that is by D earlier than the ICLK. The clock skew adjustment is to make the phases of the clocks in the integrated circuit uniform when constructing the clock tree. That is, in this first embodiment, when performing the clock skew adjustment that has conventionally been performed to make the clock phases uniform, the phase of the SDCLKO is advanced by D, thereby providing more appropriate clocks for making access to the external memory.

Further, the delay elements may be adjusted by, for example, altering the delay elements in the clock buffer or altering the wiring so that the delay value of the SDCLKO is reduced by D after the clock skew adjustment has done, i.e., after the clock phases are made uniform.

Figure 3:
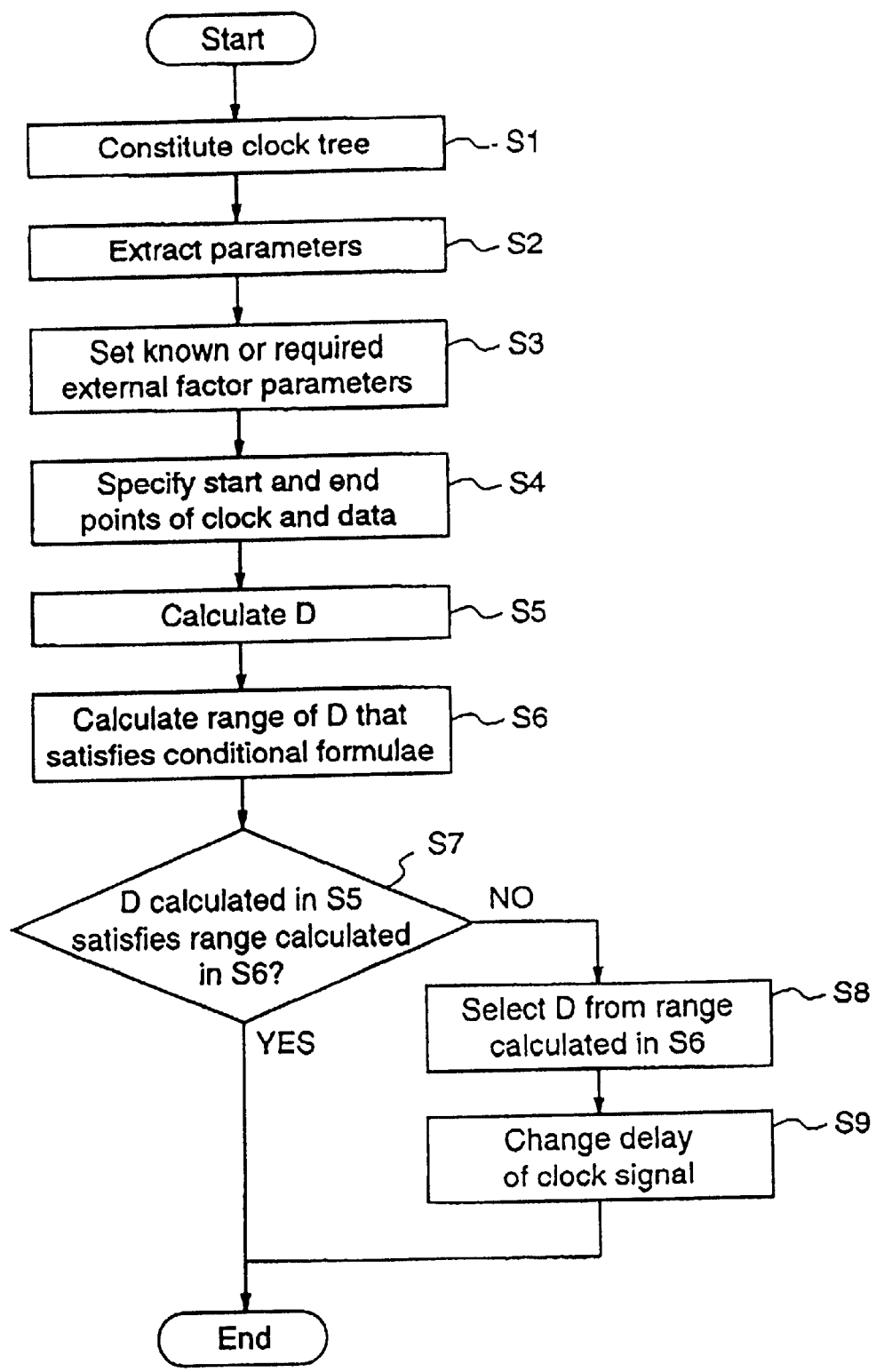
FIG. 3 is a flowchart illustrating the clock phase adjustment method applied to the integrated circuit 1000.

FIG. 3 is a flowchart for explaining the clock phase adjustment method in the integrated circuit 1000. In this method, clock phase adjustment is carried out when clock skew adjustment is carried out.

Initially, in step S1, the clock tree is constructed according to the layout of the integrated circuit 1000.

Next, in step S2, the delay parameters corresponding to the net list of the circuit are extracted from the layout.

Next, in step S3, known or required external factor parameters, for example, the data setup time and hold time of the SDRAM 110, the on-board wiring delay and wiring load, and the input load capacity of the SDRAM 110, are set in the calculation program to obtain the D.

Next, in step S4, the starting point of the internal clock ICLK and the starting point of the clock SDCLKO for the SDRAM are specified, and the arrival points of the SDCLKO and the data at the SDRAM 110, which are the endpoints of the above-mentioned conditions 1 and 2, are specified. Further, the data input pin of the second FF 107, which is the endpoint of the above-mentioned conditions 3 and 4, is specified.

Next, in step S5, the value of D is calculated on the basis of the delay parameters extracted in step S2.

Next, in step S6, the range of D is calculated using formulae (1) to (11), on the basis of the delay parameters extracted in step S2, so that the data and the control signal (command) are captured into the SDRAM 110 by the SDCLKO, and the data outputted from the SDRAM 110 is captured into the interface circuit 100 by the internal clock ICLK.

Then, in step S7, it is judged whether or not D calculated in step S5 satisfies the range of D calculated in step S6. When the D does not satisfy the range, the process goes to step S8. When the D satisfies the range, the delay values of the internal and external clock signals are not changed.

In step S8, an appropriate D is selected from the range of D calculated in step S6, and the delay value of the external clock or internal clock is charged by replacing the delay elements for clock skew adjustment or altering the wiring, on the basis of the selected D, in step S9.

When the above-mentioned method is employed, the clock phase of the integrated circuit that supplies clocks with phases of high operation reliability can be adjusted, without the necessity for the design engineer's to perform phase adjustment by trial and error like the conventional data transfer apparatus, and without the necessity to provide a special circuit for phase adjustment (e.g., the clock phase adjustment circuit 12 disclosed in Japanese Published Patent Application. No. Hei.9-185427).

The number of the clock buffers and the number of the flip-flops in the integrated circuit 1000 according to the first embodiment are not restricted to those shown in FIG. 1.

Further, although the external load capacity is 10 pF at the maximum and 3 pF at the minimum, this value depends on the system to be used.

While in this first embodiment the integrate circuit 1000 having the structure shown in FIG. 1 has been described, the structures of the interface circuit 100 and the integrated circuit 1000 are not restricted to those shown in FIG. 1, and this first embodiment is applicable to any device that makes access to an external memory using a clock. When designing a device having d structure other than shown in FIG. 1, delay parameters are obtained with reference to the above-mentioned conditions 1 to 4 and formulae (1) to (11) so that the first and second essential conditions are satisfied, and a device considering the delay parameters is designed according to the flowchart shown in FIG. 3.

As described above, when the clock phase adjustment method according to the first embodiment is employed, clock phase adjustment can be carried out by changing the values of the delay elements at clock skew adjustment or by altering the wiring, when designing the layout of a device that makes access to an external memory using a clock. Accordingly, it is possible to adjust the clock of the circuit that makes access to the external memory, without adjusting the clock phase by trial and error like the conventional one, and without performing a test for clock phase adjustment. Especially, even when high-speed access is desired like a SDRAM, the method of this first embodiment realizes easy and accurate phase adjustment for an integrated circuit that is able to make high-speed access.

Furthermore, when the integrated circuit design method according to the first embodiment is employed, an integrated circuit can be designed without performing phase adjustment by trial and error, and without performing a test for clock phase adjustment. Further, since the circuit scale and the number of steps in circuit fabrication are reduced, the power consumption is reduced. Furthermore, since the design is facilitated, the time period for development is reduced, and automation is achieved, whereby the load on the design engineer is reduced, and the design engineer is prevented from making simple mistakes in design.

Furthermore, according to the first embodiment, an integrated circuit that can supply appropriate clocks without having a complicated circuit like the conventional one, is made available. Especially, an integrated circuit provided with an interface circuit that requires high-speed access like a SDRAM, is made available.

Embodiment 2

In the first embodiment, the parameters inside the integrated circuit 1000 do not greatly vary among systems on which the integrated circuit 1000 is mounted and, therefore, these parameters can be predicted within the range of variation of parameters extracted from the layout. However, parameters depending on external factors, for example, the on-board wiring load and wiring delay, the input load capacity of the SDRAM 110, and the like, vary among systems on which the integrated circuit 1000 is mounted. Therefore, in this second embodiment, a description will be given of a clock phase adjustment method utilizing the clock phase adjustment method according to the first embodiment and considering the variation of systems, and an integrated circuit provided with an interface circuit that makes access Lo an external memory, and a method for designing the integrated circuit.

In the clock phase adjustment method according to the second embodiment, initially a phase difference D is obtained by a method (described later) to which the clock phase adjustment method of the first embodiment is applied, and delays in clock signals are continuously monitored so as to deal with variations in delay values due to external factors when the integrated circuit is mounted on an arbitrary system, and a D value is selected according to the phase difference of the detected clock signals.

Figure 4:
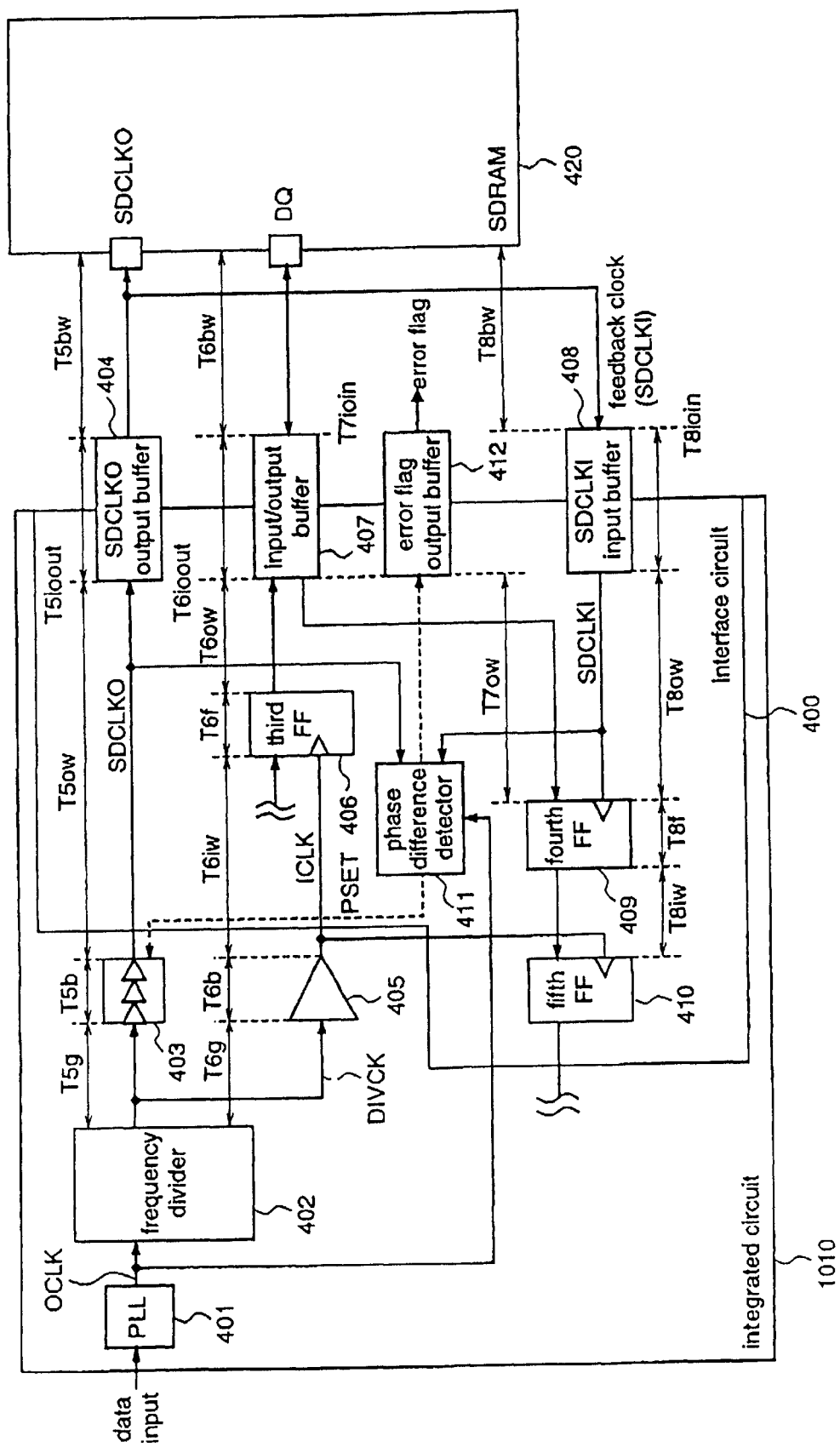
FIG. 4 is a block diagram illustrating the circuit structure of an integrated circuit 1010 according to a second embodiment.

FIG. 4 is a block diagram illustrating a part of the structure of an integrated circuit 1010 provided with an interface circuit 400, which is fabricated utilizing the clock phase adjustment method according to the second embodiment. In FIG. 4, the structure of the integrated circuit 1010 relating to access to a SDRAM 420 is schematically shown for the sake of simplicity. The integrated circuit 1010 is mounted on an arbitrary system that makes data access to the SDRAM 420.

The integrated circuit 1010 comprises an interface circuit 400, a PLL 401 and a frequency divider 402 serving as a clock generator, a third clock buffer 403, and a fourth clock buffer 405. The interface circuit 400 comprises a SDCLKO output buffer 404 for outputting SDCLKO, a third flip-flop (third FF) 406 as an output flip-flop, an input/output buffer 407 for inputting/outputting data, a SDCLKI input butter 408, a fourth flip-flop (fourth FF) 409, a fifth flip-flop (fifth FF) 410 as an input flip-flop, a phase difference detector 411, and an error flag output buffer 412. In the figure, arrows accompanied with parameters starting with T are delay parameters relating to signal transmission in the integrated circuit 1010 and signal transmission between the integrated circuit 1010 and the SRAM 420.

The PLL circuit 401 outputs, for example, a clock OCLK of 1080 MHz that is obtained by multiplying 27 MHz.

The frequency divider 402 divides the clock supplied from the PLL 401 to generate a reference clock of 67.5 MHz.

The third clock buffer 403 receives the clock outputted from the frequency divider 402, and drives a clock SDCLKO to be supplied to an external memory, i.e., the SDRAM 420. Further, the third clock buffer 403 has a structure that can select a delay value, as described later.

The fourth clock buffer 405 drives the clock DIVCK outputted from the frequency divider 402, generates a clock ICLK to operate the inside of the integrated circuit 1010, and supplies the ICLK to the respective constituents of the integrated circuit 1010.

The third FF 406 outputs latched data, in synchronization with the ICLK, through the input/output buffer 407 to the SDRAM 420, like the first FF 105.

The SDCLKI input buffer 408 is a butter that receives a feedback clock SDCLKI of the SDCLKO inputted to the SDRAM 420.

The fourth FF 409 captures read data which has been read from the data in the SDRAM 420 according to a SDRAM command, through the input/output buffer 407, in synchronization with the feedback clock SDCKT.

The fifth FF 410 latches the data captured in the fourth FF 409, with the operating clock ICLK of the integrated circuit 400.

The phase difference detector 411 receives the SDCLKO to be supplied to the SDRAM 420, the clock SDCLKI that has been fed back from the SDRAM 420, and the OCLK outputted from the PLL 401, and the detector 411 has the function of detecting a phase difference PD between the SDCLKO and the SDCLKI, and the function of selecting D according to the PD.

Further, the phase difference detector 411 detects a phase difference PD between the SDCLKO and the SDCLKI using the OCLK, and selects a predetermined phase difference D from the detected PD, and determines a delay value SDCLKDLY of the SDRAM clock using the following formula (16). The D is represented by the following formula.

$$D = (T6g + T6b + T6iw) - (T5g + T5b + T5ow)$$

wherein T6g indicates the wiring delay from the frequency divider 402 to the fourth clock buffer 405, T6b indicates the cell delay of the fourth clock buffer 405, T6iw indicates the wiring delay from the fourth clock buffer 405 to the third FF 406, T5g indicates the wiring delay from the frequency divider 402 to the third clock buffer 403, T5b indicates the cell delay of the third clock buffer 403, and T5ow indicates the wiring delay from the third clock buffer 403 to the SDCLKO output buffer 404. Further, formula (16) is as follows.

$$SDCLKDLY = T5g + T5b + T5ow = (T6g + T6b + T6iw) - D \quad (16)$$

The error flag output buffer 412 outputs an error flag when the phase difference detector 411 generates an error.

In this second embodiment, first and second essential conditions should be satisfied, as in the first embodiment. Assuming that the clock generator of the SDCLKO and the ICLK is the frequency divider 402, the first essential condition is described as follows, like conditions 1 and 2 of the first embodiment.

Condition 5: A first value obtained by subtracting "the time from when the SDCLKO is outputted from the frequency divider 402 to when it reaches the SDRAM 420" from the sum of "the time from when the ICLK is outputted from the frequency divider 402 to when it reaches the third FF 406" and "the time from when data is outputted from the third FF 406 by the ICLK to when it reaches the SDRAM 420" should be larger than the data hold time that is required for the SDRAM 420 to capture the data; and a value obtained by subtracting the first value from a period of time corresponding to one cycle of the SDCLKO should be larger than the data setup time required for the SDRAM 420 to capture the data.

Further, the second essential condition is described as follows.

Condition 6: A value obtained by subtracting "the time from when the internal clock is outputted from the frequency divider 402 to when it reaches the fifth FF 410" from a value (hereinafter referred to as V1) obtained by summing "the time during which the external clock is outputted from the frequency divider 402 to reach the external memory, i.e., the SDRAM 420, turns to the integrated circuit 1010 as a feedback clock from the SDRAM 420, and reaches the fourth FF 409 that is a flip-flop to capture the data from the SDRAM 420 by the feedback clock" and "the cell delay of the fourth FF 409" and "the wiring delay from the fourth FF 409 to the fifth FF 410 that is a second-stage data capturing flip-flop operating on the internal clock" should be larger than the hold time of the fifth FF 410.

Condition 7: A value obtained by subtracting the value V1 from the sum of "the time from when the internal clock is outputted from the frequency divider 402 to when it reaches the fifth FF 410" and "the time corresponding to one cycle of the SDRAM clock" should be larger than the setup time of the fifth FF 410.

Condition 8: The value V1 should be larger than "the time from when the internal clock is outputted from the frequency divider 402 to when it reaches the fifth FF 410".

Condition 9: The feedback clock SDCLKI should not be greatly delayed from the data DQ outputted from the SDRAM 420, that is, a value obtained by subtracting "the time from when the SDRAM clock is fed back from the SDRAM 420 to when it reaches the fourth FF 409" from "the time from when data is outputted from the SDRAM 420 to when it reaches the fourth FF 409 (hold time+wiring delay+input buffer delay)" should be larger than the hold time of the fourth FF 409.

Condition 5 is represented by formula (17) in which the parameters of formula (6) are applied to the second embodiment.

$$SDHOLD-(T6f+T6ow+T6ioout+T6bw-T5ioout-T5bw)<D<SDCLKCYCLE-SDSETUP-(T6f+T6ow+T6ioout+T6bw-T5ioout-T5bw) \quad (17)$$

wherein SDHOLD indicates the hold time required for data input into the SDRAM 420, T6$f$ indicates the cell delay of the third FF 406, T6$ow$ indicates the wiring delay from the third FF 406 to the input/output buffer 407, T6$io$out indicates the output delay of the input/output buffer 407, T6$bw$ indicates the wiring delay from the input/output buffer 407 to the SDRAM 420, T5$io$out indicates the output delay of the SDCTLKO output buffer 404, SDCLKCYCLE indicates the time corresponding to one cycle of the clock SDCLKO supplied to the SDRAM 420, and SDSETUP indicates the setup time required for data input into the SDRAM 420.

Conditions 6 and 7 are represented by formula (18).

$$T5ioout+T5bw+T8bw+T8ioin+T8ow+T8f+T8iw-SDCLKCYCLE+T5FSETUP<D<T5ioout+T5bw+T8bw+T8ioin+T8ow+T8f+T8iw-T5FHOLD \quad (18)$$

where T8$bw$ indicates the wiring delay from the SDRAM 420 to the SDCLKI input buffer 408, T8$io$in indicates the buffer delay of the SDCLKI input buffer 408, T8$ow$ indicates the wiring delay from the SDCLKI input buffer 408 to the fourth FF 409, T8$f$ indicates the cell delay of the fourth FF 409, T8$iw$ indicates the wiring delay from the fourth FF 409 to the fifth FF 410, T5FSETUP indicates the setup time required for data input to the fifth FF 410, and T5FHOLD indicates the hold time required for data input to the fifth FF 410. Further, since the SDCLKO and the ICLK are generated by the frequency divider 402, these clocks has the same period of time corresponding to one cycle.

Since the phase difference PD detected by the phase difference detector 411 is a phase difference between the point of time when the external clock is outputted from the integrated circuit 1010 and the point of time when the external clock reaches the integrated circuit 1010 as a feedback clock from the external memory, it is represented by $$PD=T5ioout+T5bw+T8bw+T8ioin+T8ow \quad (19)$$

and formula (18) is reduced to $$PD+T8f+T8iw-SDCLKCYCLE+T5FSETUP<D<PD+T8f+T8iw-T5FHOLD \quad (20)$$

Condition 8 is represented by $$D<T5ioout+T5bw+T8bw+T8ioin+T8ow+T8f+T8iw$$

and condition 8 is satisfied when formula (18) is satisfied.

Condition 9 is represented by $$SDQHOLD+T6bw+T7ioin+T7ow-(T8bw+T8ioin+T8ow)>T4FHOLD$$

wherein SDQHOLD indicates the hold time of the data DQ outputted from the SDRAM 420, T7$io$in indicates the buffer delay of the input/output butter 407, T7$ow$ indicates the wiring delay from the input/output buffer 407 to the fourth FF 409, and T4FHOLD indicates the hold time required for data input to the fourth FF 409.

The above formula that represents condition 7 is satisfied by providing equal-length wiring with respect to T6$bw$, T7$io$in, T7$ow$, T8$bw$, T8$io$in, and T8$ow$. Usually, condition 7 is indispensable in the interface circuit to which the clock inputted to the external memory is fed back, and it is premised that, in this second embodiment, condition 7 is already satisfied by the above-mentioned equal-length wiring.

In formulae (17) to (20), the parameters due to external factors, for example, the on-board wiring load and wiring delay, the input load capacity of the SDRAM 420, and the like, vary among systems on which the integrated circuit is mounted. However, the internal parameters of the interface circuit 400, for example, T6$f$, T6$ow$, T8$f$, T8$iw$, T5FSETUP, and T5FHOLD, do not greatly vary among the systems, and these parameters are predictable in the range of variation of parameters extracted from the layout. Therefore, when the predictable parameters extracted from the layout are substituted into formula (20) and the range of D is calculated for each of the MAXIMUM condition and the MINIMUM condition, since part of formula (20) other than the PD does not vary with the external load capacity, formula (20) becomes a linear inequality with the PD as a variable.

For example, when the predictable parameters extracted from the layout are substituted into formula (20) and calculation is carried out on the assumption that the phase difference D in the MAXIMUM condition is about twice what it is in the TYPICAL time as described for the first embodiment, formula (20) is reduced to $$PD/2+d1<D<PD/2+d2 \quad (20-1)$$

and, when calculation is carried out on the assumption that the phase difference D in the MINIMUM condition is about half what it is in the TYPICAL time as described for the first embodiment, formula (20) is reduced to $$2PD+d3<D<2PD+d4 \qquad (20\text{-}2)$$

wherein d1, d2, d3, and d4 are the constants obtained by substituting the predictable parameters extracted from the layout into formula (20).

Figure 5:
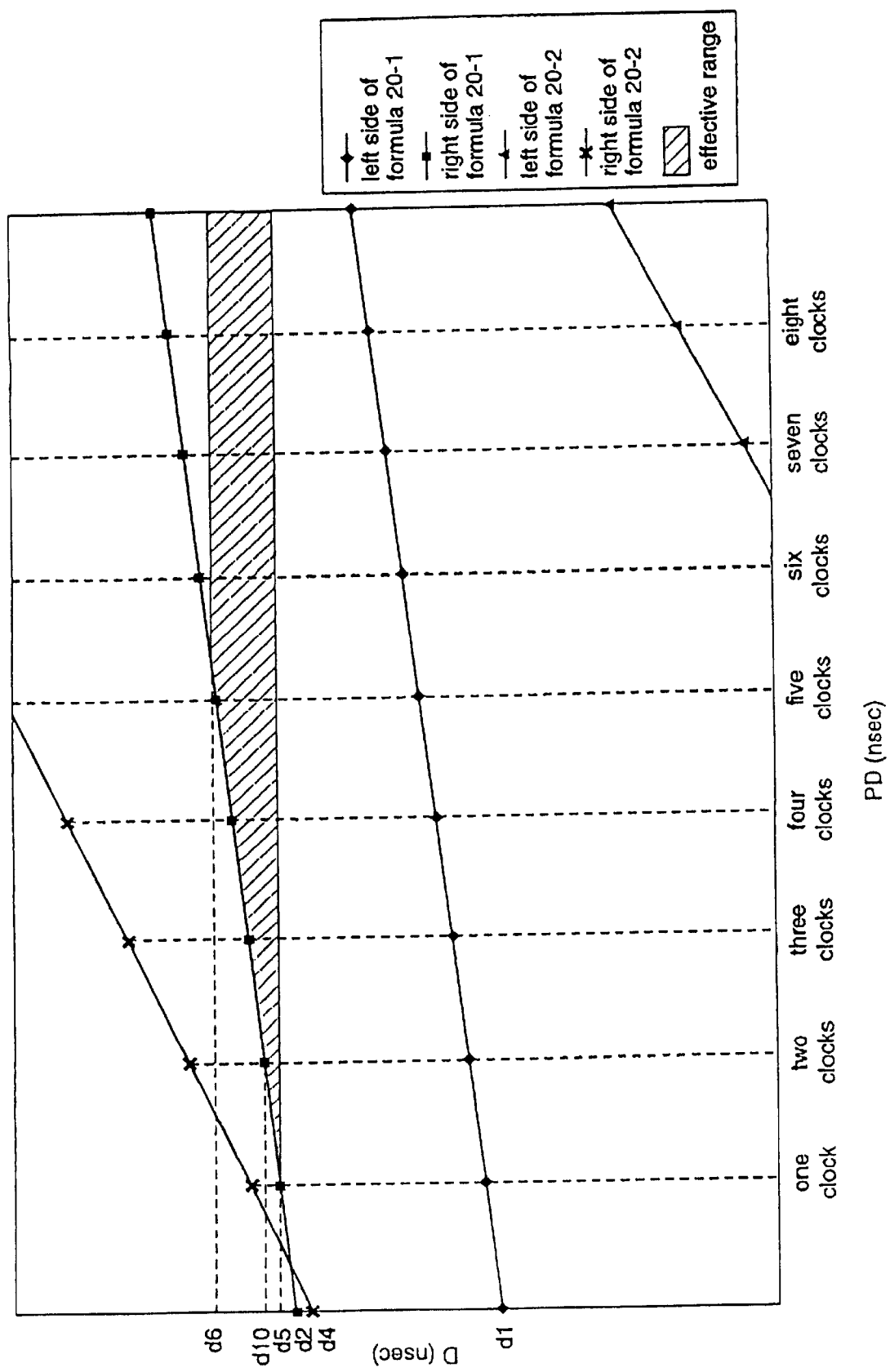
FIG. 5 is a graph showing formula (20-1) and formula (20-2).

Since the phase difference PD is a variable, when d2>d4>d1>d3 holds, formulae (20-1) and (20-2) are graphed as shown in FIG. 5. The range of D represented by formula (20-1) is between a line with black squares and a line with black rhombuses on the graph of FIG. 5. The range of D represented by formula (20-2) is between a line with black rectangles and a line with crosses on the graph of FIG. 5.

On the other hand, the range of D is calculated according to formula (17) that is a conditional formula defining a difference between the time when the SDCLKO reaches the SDRAM 420 and the time when the data outputted from the interface circuit 400 reaches the SDRAM 420. At this time, the wiring delays due to T5*io*out, T6*io*out, T5*bw*, and T6*bw* cause about the same load when equal-length wiring is intended, and the delays occur relatively to each other and, therefore, these delays exert less influence on formula (17). So, even when the external load capacity varies, formula (17) can be represented by an inequality having no variation.

For example, it is assumed that the following formula (17-1) is obtained by substituting the predictable parameters extracted from the layout into formula (17).

$$d5<D<d6 \qquad (17\text{-}1)$$

wherein d5 and d6 indicate constants obtained when substituting the predictable parameters extracted from the layout into formula (17).

Formula (17-1) is reflected on the graph of FIG. 5 assuming that d5>d2, and an effective range that satisfies formulae (20-1), (20-2), and (17-1) is indicated by a diagonally shaded area. A phase difference D is arbitrarily selected from the diagonally shaded effective range.

When some restriction is put on the available range of D, the effective range of D may be determined on the basis of the restriction. For example, when the lower is d7, formula (17-1) is represented by $$d7<D<d6 \text{ when } d5<d7,$$

and $$d5<D<d6, \text{ when } d5>d7$$

In this second embodiment, since, as described later, the phase difference detector 411 detects the phase difference PD between the SDCLKO and the SDCLKI according to the number of counts on the OCLK, the phase difference D may be selected from the range of D at the time when the PD matches the number of counts on the OCLK, from the effective range of D. For example, when PD=2, the phase difference D is selected from d5<D<d10.

When fabricating the integrated circuit 1010, the initial set value of D is selected by the above-mentioned method. That is, if a phase difference corresponding to 2 clocks of OCLK is selected as the initial set value of PD, the initial set value of D is selected from d5<D<d10. Like the first embodiment, a clock tree of the integrated circuit 1010 is constructed on the basis of the selected initial set value, thereby obtaining a desired integrated circuit 1010. Although in this second embodiment the phase difference D is selected on the basis of the number of counts on the OCLK, tho selection method is not restricted thereto, and the phase difference D may be selected according to the system on which the integrated circuit 1010 is mounted.

The integrated circuit 1010 according to the second embodiment has the structure in which, after being mounted on a predetermined system, a value of D appropriate to the phase difference detected by the phase difference detector 411 can be selected from plural values of D which have previously been selected according to the above-mentioned method. Therefore, this second embodiment can provide a clock phase adjustment method, an integrated circuit, and a design method thereof, by which appropriate clocks are automatically outputted even when the delay parameters vary due to external factors.

Next, a detailed description will be given of a structure and a method for selecting a value of D on the basis of the phase difference detected by the phase difference detector 411 after the integrated circuit 1010 is mounted on a predetermined system.

The phase difference detector 411 counts, with the OCLK, the phase difference between the SDCLKO and the SDCLKI, and selects the set value PSET to be outputted to the third clock buffer 403 on the basis of the count, i.e., the phase difference. The set value PSET is a value corresponding to the delay value SDCLKDLY.

The phase difference detector 411 is provided with a table on which each of the phase differences indicated by the count value is associated with predetermined phase difference D, PSET, and error flag output, and the detector 411 selects the PSET with reference to the table.

FIG. 6 shows an example of a table possessed by the phase difference detector 411. A table 411-1 has a display section 411-2 where the count of the OCLK is shown, a display section 411-3 where the value of D corresponding to each PD is shown, a display section 411-4 where the set value PSET to be outputted to the third clock buffer is shown, and a display section 411-5 where the output of error flag is shown by "H" while non-output of error flag is shown by "L".

At this time, the D to be set to each PD is an arbitrary value previously selected corresponding from the range that is obtained from the effective range of D as shown in the graph of FIG. 5, and the detected PD. For example, when PD=2 clocks, the D is previously selected from the range of dS<D<d10 with reference to the graph of FIG. 5.

Further, when the range of D according to formula (20) does not satisfy the range of formula (17) (in FIG. 5, when the PD corresponds to one clock or six clocks), "H" is displayed in the error flag display section 411-5. For example, on the table 411-1, "H" is displayed in the error flag display section 411-5 when the PD corresponds to one clock or six clocks, and this means that D11 and D16 do not satisfy formula (17-1). The set value PSET corresponds to a tri-state buffer possessed by the third clock buffer, which will be described later.

In this second embodiment, an error flag is outputted from the error flag output buffer 412 when the D corresponding to the PD detected by the phase difference detector 411 is not obtained. However, since the error flag output can be avoided if an external load is added to T6*io*out or the like, the error flag is not an indispensable function.

Figure 7:
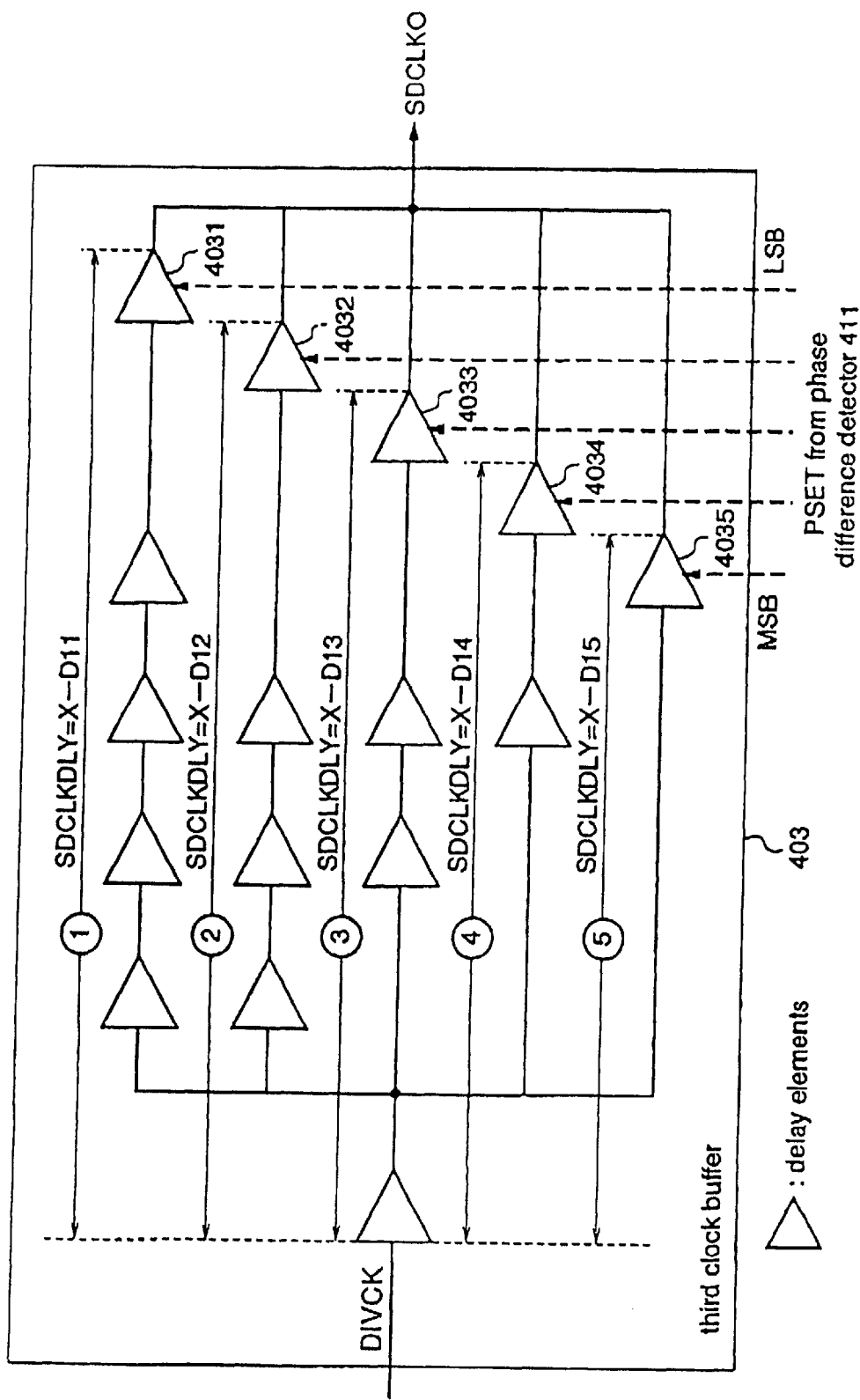
FIG. 7 is a block diagram illustrating the structure of a third clock buffer 403.

FIG. 7 is a block diagram illustrating an example of the structure of the third clock buffer 403. The third clock buffer 403 is provided with a plurality of signal lines (in FIG. 7, ①~⑤) having different numbers of delay elements so that the SDCLKDLY obtained from formula (16) is selected according to the PD detected by the phase difference detector 411. For example, ① in FIG. 7 indicates line to which a clock providing that SDCLKDLY=(T6g+T6b+T6iw)−D11 is outputted. In FIG. 7, X=T6g+T6b+T6iw.

Last delay elements 4031 to 4035 of the respective lines are called tri-state buffers, and selected according to the set value PSET outputted from the phase difference detector 411. A signal outputted from the selected tri-state buffer is SDCLKO. The respective numbers of each PSET shown in FIG. 6 correspond to the tri-state buffers 4031 to 4035 in FIG. 7. That is, the least significant bit (LSB) of the PSET corresponds to the buffer 4031. When the LSB of the PSET is "1", the buffer 4031 is selected. When the LSB is "0", the buffer 4031 is not selected. In FIG. 6, when D=D16, the PSET is set at "10000". The reason is as follows. When D=D16, the SDCLKDLY (−X−D16) is very short so that the signal lines shown in FIG. 7 cannot deal with it, and the signal line ⑤ having the smallest delay value is used.

Figure 8:
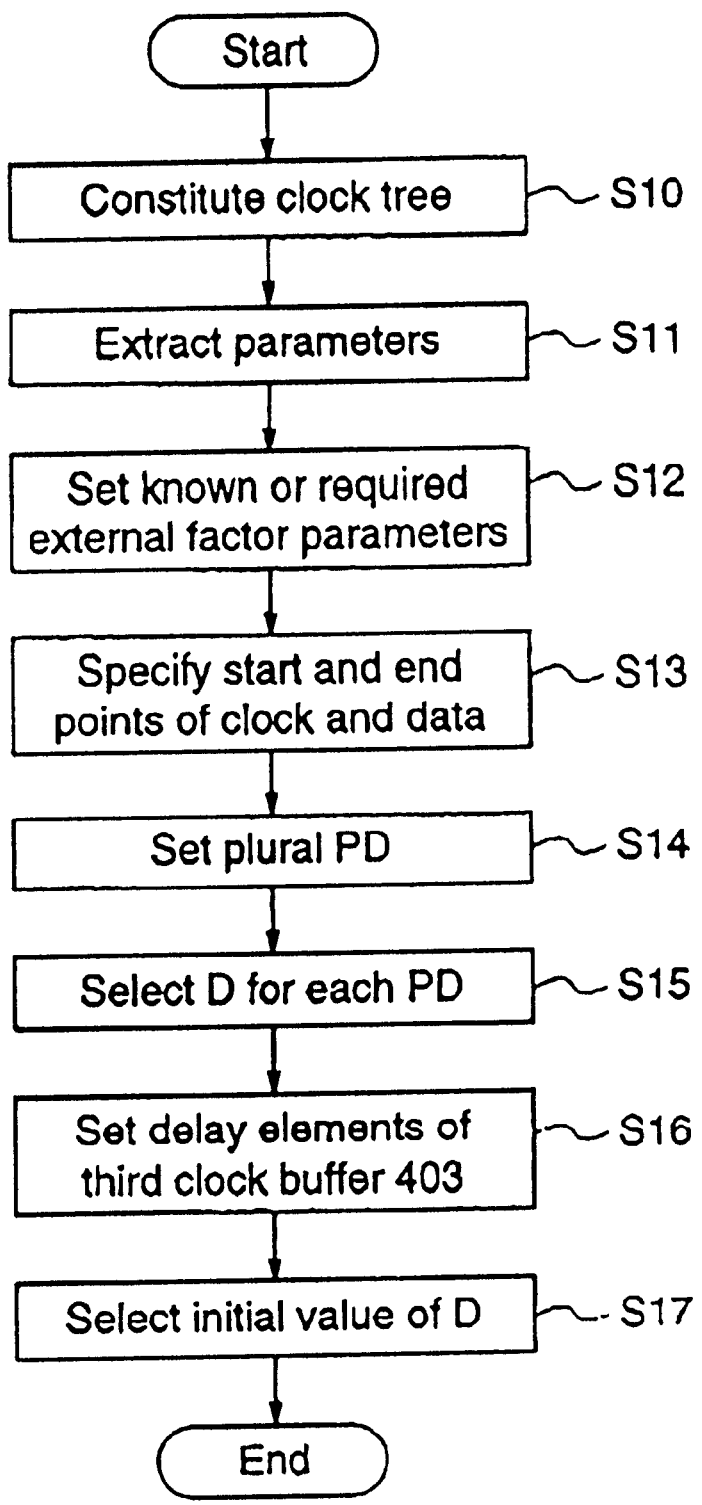
FIG. 8 is a flowchart illustrating the clock phase adjustment method applied to the integrated circuit 1010.

FIG. 8 is a flowchart illustrating a clock phase adjustment method to be performed when clock skew adjustment is performed on the integrated circuit 1010. Clock skew adjustment to be performed after the integrated circuit 1010 is mounted will be described later.

Initially, in step S10, a clock tree is constructed according to the layout of the integrated circuit 1010.

Next, in step S11, the delay parameters corresponding to the net list of the circuit are extracted from the layout.

Next, in step S12, known or desired external factor parameters, for example, the data setup of the SDRAM 420, the hold time, the on-board wiring delay and wiring load, and the input load capacity of the SDRAM 420, are set in the calculation program to obtain D.

Next, in step S13, the start point of the internal clock ICLK and the start point of the SDRAM clock SDCLKO are specified, and the reach point of the SDCLKO to the SDRAM 420 and the reach point of data to the SDRAM 420, which are the end point of the above-mentioned condition 5, are specified. Further, the data input pin of the fifth FF 410, which is the end point or the above-mentioned conditions 6 to 9, is specified.

In step S14, plural values of PD are arbitrarily set. Since the phase difference PD is counted by the OCLD, the values of PD are set on the basis of the number of clocks of the OCLK.

In step S15, the range of the phase difference D is calculated using formulae (17) to (20), on the basis of the delay parameters extracted in step S11, such that the data and the control signal (command) are captured into the SDRAM 420 by the SDCLKO, and the data outputted from the SDRAM 420 is captured into the interface circuit 400 by the feedback clock SDCLKI. Then, phase differences D are selected corresponding to the respective set values of PD.

Next, the delay elements of the third clock buffer 403 are set on the basis of the D determined in step S15 (step S16), and an initial value is arbitrarily selected from the phase differences D determined in step S15 (step S17).

Hereinafter, a description will be given of the operation of the phase difference detector 411 and the clock phase adjustment after the integrated circuit 1010 is mounted on the predetermined system, with reference to FIGS. 4, 6, and 7.

It is now assumed that the phase difference D is in the initial state, for example, PD=3 clocks, that is, the D is set at D13, and the phase difference detector 411 counts the phase difference PD equivalent to two clocks of the OCLK after turning on the power on the mount substrate. Since the value of D is D12 from FIG. 6, the phase difference detector 411 outputs the set value "00010" to the third clock buffer 403 so that the signal line of the third clock buffer 403 is switched to D=D12.

In the third clock buffer 403, the tri-state buffer 4032 corresponding to the set value "00010" is selected, and the SDCLKO is outputted from the selected buffer 4032.

As described above, even when there are variations in the delay due to the mount board and the external load, since the LSI itself detects the phase difference automatically and sets the phase difference D, the LSI can be easily applied to plural kinds of systems.

The integrated circuit 1010 is designed according to the procedure as follows.

Initially, the layout of the integrated circuit 1010 is fabricated, and the range of D is calculated using the respective parameters extracted from the layout and formulae (17) and (20).

Then, the table 411-1 of the phase difference detector 411 is created on the basis of the obtained range of D.

Then, the clock tree of the third clock 403 is created on the basis of the table 411-1 and formula (16).

Since the above-mentioned design method is employed, it is possible to easily fabricate an integrated circuit that considers the variety of systems on which the integrated circuit is mounted, and is able to supply clocks with phases of high operating reliability, without the necessity for the design engineer to perform phase adjustment by trial and error, and without the need for a special circuit for phase adjustment.

As described above, the phase difference between the internal clock and the external clock can be adjusted by detecting the phase difference between the external clock to be outputted to the external memory and the feedback clock from the external memory. Accordingly, even when there are variety of external factors, such as the wiring delay of the system on which the integrated circuit is mounted, the external load capacity, and the like, an optimum clock phase is easily adjusted.

While in this second embodiment the OCLK is 1080 MHz and the frequency-divided reference clock is 67.5 MHz, these clocks may have arbitrary frequencies. Further, the construction of the third clock buffer 403 is not restricted to that shown in FIG. 7. Furthermore, while the phase difference detector 411 detects the phase differences of the respective clocks and counts the differences to measure the time, an arbitrary phase comparison means may be employed. Moreover, while in this second embodiment the error flags are outputted, the error flags are not necessarily outputted. Further, the error flags may be shared with another pin.

While in this second embodiment the integrated circuit 1010 provided with the interface circuit 400 shown in FIG. 4 has been described, the structure of the integrated circuit is not restricted to that shown in FIG. 4, and this second embodiment is applicable to any device that makes access to an external memory using clocks. When designing a device having a structure other than that shown in FIG. 4, delay parameters are obtained with reference to the above-mentioned conditions 5 to 7 and formulae (16) to (20) so as to satisfy the first and second essential conditions, and the delay parameters are selected according to the phase difference of the external clocks.

Embodiment 3

While the first embodiment is premised on perfect synchronous design, a circuit that adopts a feedback clock system may be implemented by the phase adjustment method and the design method as described for the first embodiment.

Figure 9:
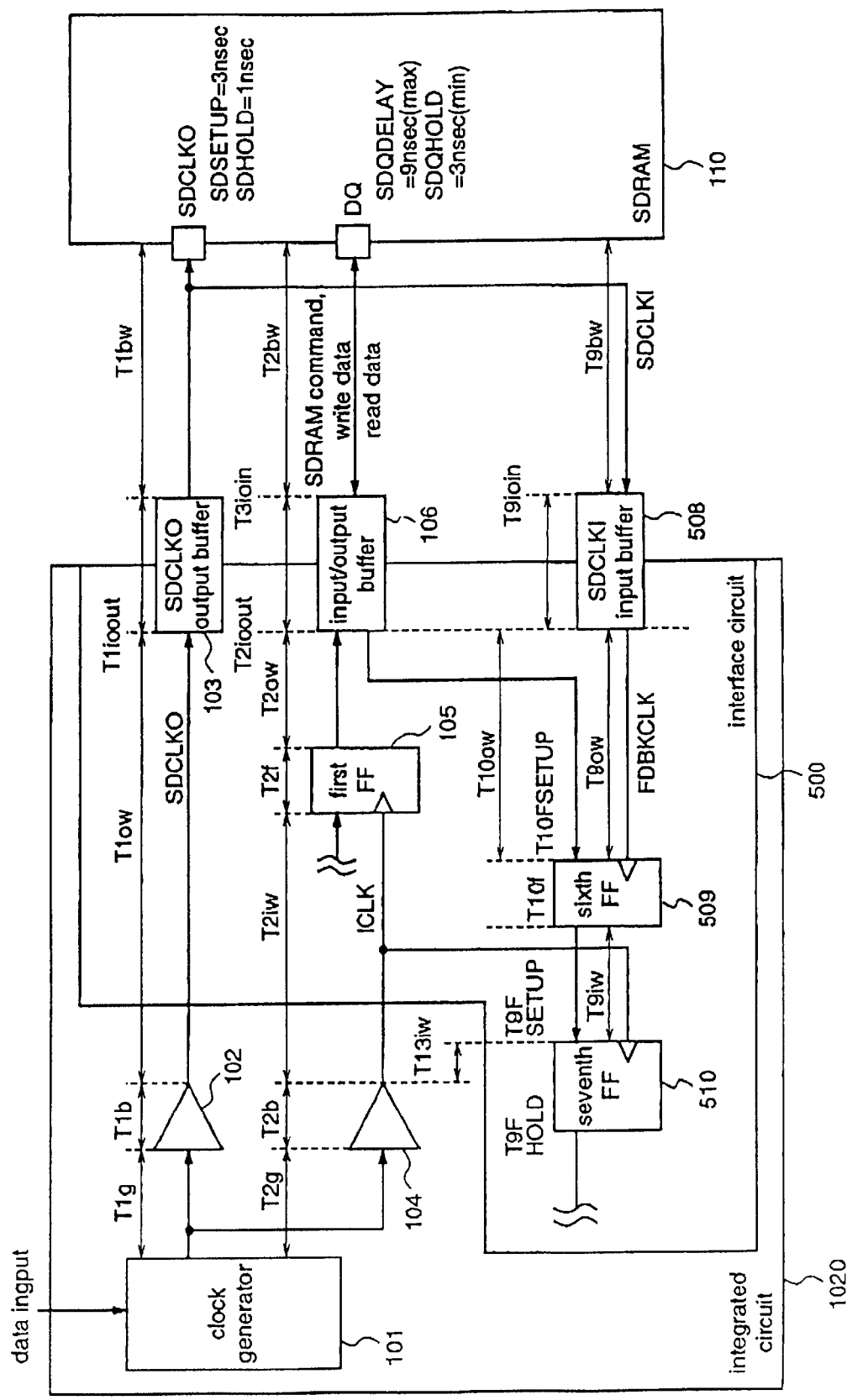
FIG. 9 is a block diagram illustrating the circuit construction of an integrated circuit 1020 according to a third embodiment.

FIG. 9 is a block diagram illustrating part of the structure of an integrated circuit 1020 including an interface circuit 500 that makes access to an external memory, i.e., a SDRAM 110, and this integrated circuit 1020 is fabricated using a clock phase adjustment method according to the third embodiment. In FIG. 9, only part of the structure of the integrated circuit 1020 relating to access to the SDRAM 110 is schematically shown for the sake of simplicity. Further, the same constituents as those mentioned for the first embodiment are given the same reference numerals, and description thereof will be omitted.

The integrated circuit 1020 comprises a clock generator 101, a first clock buffer 102, a second clock buffer 104, and an interface circuit 500. The interface circuit 500 comprises a SDCLKO output buffer 103, a first flip-flop (first FF) 105 as an output flip-flop, an input/output buffer 106, a SDCLKI input buffer 508, a sixth flip-flop (sixth FF) 509 as an input flip-flop, and a seventh flip-flop (seventh FF) 510. In the figure, arrows accompanied with parameters starting with T are delay parameters relating to signal transmission in the integrated circuit 1020 and signal transmission between the integrated circuit 1020 and the SDRAM 420.

The SDCLKI input buffer 508 is a buffer that receives a feedback clock SDCLKI of SDCLKO inputted to the SDRAM 420.

The sixth FF 509 captures the data read from the SDRAM 110 by a SDRAM command, through the input/output buffer 106, in synchronization with the feedback clock SDCLKI.

The seventh FF 510 latches the data captured by the sixth FF 509 with the operating clock ICLK of the integrated circuit 1020.

The second clock buffer 104 drives the reference clock, generates the internal clock ICLK for operating the inside of the integrated circuit 1020, and supplies the ICLK to the constituents of the integrated circuit 1020. FIG. 9 shows the case where the ICLK is outputted to the first FF 105 and the seventh FF 510, for the sake of simplicity.

Figure 10:
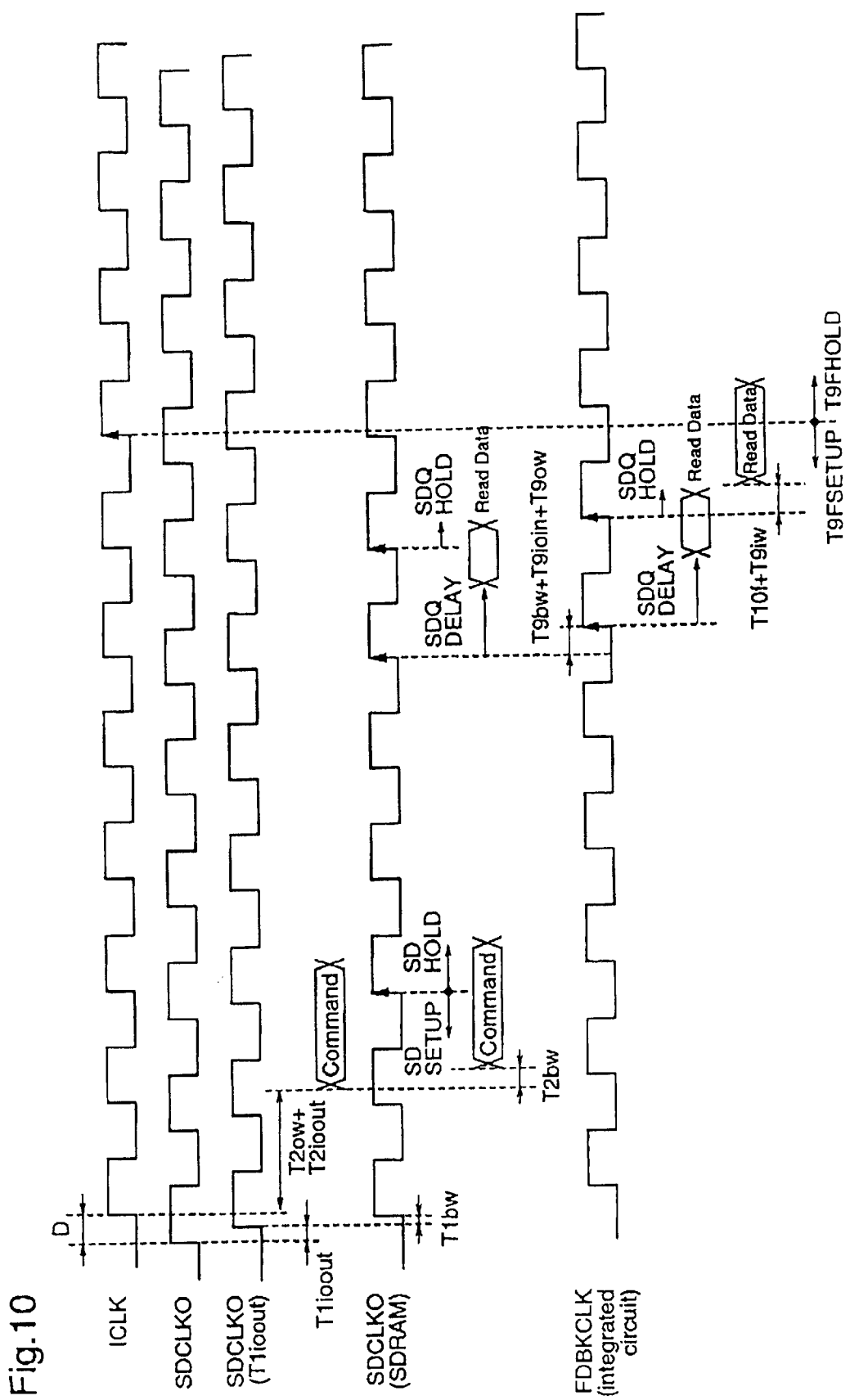
FIG. 10 is a timing chart illustrating the relationship in phases between clocks and data.

FIG. 10 is a timing chart illustrating the relationship in phases between clocks and data when reading data. Hereinafter, the relationship in phases between clocks and data will be described with reference to FIGS. 9 and 10. The chart until the SDCLKO signal the SDRQAM command reach the SDRAM 110 is identical to that shown in FIG. 2 and, therefore, repeated description is not necessary.

The feedback clock SDCLKI of the SDCLKO turns back at the SDRAM 110 and reaches the sixth FF 509 with a delay of T9$bw$+T9$io$in+T9$ow$. It is assumed that T9$bw$+T9$io$in+T9$ow$≈T2$bw$+T3$io$in +T10$ow$, as described with respect to the first embodiment.

The data to be read is read out after a period of time indicated by SDQDELAY from when the SDCLKO reaches the SRAM 110.

Further, from the above condition, it is considered that the read data reaches the sixth FF 509 after a period of time indicated by the SDQDELAY from when the SDCLKI reaches the sixth FF 509.

The data latched by the sixth FF 509 in synchronization with the SDCLKI reaches the seventh FF 510 after a period of time indicated by T10$f$+T9$iw$. T10$f$ indicates a delay in the sixth FF 509, and T9$iw$ indicates a wiring delay from the sixth FF 509 to the seventh FF 510.

In FIG. 10, the hold time of data DQ outputted from the SDRAM 110 is indicated by SDQHOLD, and the setup time and the hold time required for data input to the seventh FF 510 are indicated by T9FSETUP and T9FHOLD, respectively.

Next, a description will be given of the method of calculating the clock phase difference D, which is important in the clock phase adjustment method for a data transfer circuit.

Conditions 6 to 9 described for the second embodiment are applied to the third embodiment, in addition to conditions 1 and 2 described for the first embodiment.

Condition 10: A value obtained by subtracting "the time from when the internal clock is outputted from the clock generator 101 to when it reaches the seventh FF 510" from a value (hereinafter, referred to as V2) obtained by summing "the period of time during which the external clock, i.e., the SDRAM clock, is outputted from the clock generator 101 to reach the external memory, i.e., the SDRAM 110, turns back from the SDRAM 110 as a feedback clock to be inputted to the integrated circuit 1020 and, thereafter, reaches the sixth FF 509, i.e., a flip-flop for capturing the data from the SDRAM 110 by the feedback clock" and "the cell delay of the sixth FF 509" and "the wiring delay from the sixth FF 509 to the seventh FF 510, i.e., a second-stage data capturing flip-flop that operates on the internal clock" should be larger than the hold time of the seventh FF 510.

Condition 11: A value obtained by subtracting the value V2 from the sum of "the time from when the internal clock is outputted from the clock generator 101 to when it reaches the seventh FF 510" and "the time corresponding to one cycle of the SDRAM clock" should be larger than the setup time of the seventh FF 510.

Condition 12: The value V2 should be larger than "the time from when the internal clock is outputted from the clock generator 101 to when it reaches the seventh FF 510".

Condition 13: A value obtained by subtracting "the time required for the SDRAM clock fed back from the SDRAM 110 to reach the sixth FF 509" from "the time required for the data outputted from the SDRAM 110 to reach the sixth FF 509 (hold time+wiring delay+input buffer delay)" should be larger than the hold time of the sixth FF 509.

Conditions 10 to 13 are obtained by satisfying the following formulae. It is assumed that, from the result of clock skew adjustment, the wiring delay T13$iw$ from the second clock buffer 104 to the seventh clock buffer 510 is T13$iw$≈T2$iw$.

Condition 10:

$$(CKD+T9bw+T9io\text{in}+T9ow)+T10f+T9iw-MCKD>T9FHOLD$$

wherein T9$bw$ indicates the wiring delay from the SDRAM 110 to the SDCLKI buffer 508, T9$io$in indicates the buffer delay of the SDCLKI input buffer 508, T9$ow$ indicates the wiring delay from the SDCLKI input buffer 508 to the sixth FF 509, T9$iw$ indicates the wiring delay from the sixth FF 509 to the seventh FF 510, and T9FHOLD indicates the hold time required for data input to the seventh FF 510.

Condition 11:

$$(MCKD+SDCLKCYCLE)-(CKD+T9bw+T9io\text{in}+T9ow+T10f+T9iw)>T9FSETUP$$

wherein T9FSETUP indicates the setup time required for data input to the seventh FF 510.

Condition 12:

$$CKD+T9bw+T9io\text{in}+T9ow+T10f|T9iw>MCKD$$

Condition 13:

$$SDQHOLD+T2bw+T3io\text{in}+T10ow-(T9bw+T9io\text{in}+T9ow)>T10FHOLD$$

The following three formulae are obtained from the above-mentioned formulae for satisfying conditions 8 to 11.

$$T1ioout+T1bw+T9bw+T9ioin+T9ow+T10f+T9iw-\\T9FHOLD>D>T1ioout+T1bw+T9bw+T9ioin+T9ow+T10f+\\T9iw-SDCLKCYCLE+T9FSETUP$$

$$T1ioout+T1bw+T9bw+T9ioin+T9ow+T10f+T9iw>D$$

$$SDQHOLD+T2bw+T3ioin+T10ow-(T9bw+T9ioin+\\T9ow)>T10FHOLD$$

For example, when the MAX condition and the MINIMUM condition shown in Table 1 and Table 2 should be satisfied as described in the first embodiment, the ranges of D are represented by $$1.652<D<3.64$$

$$1.612<D<2.94$$

and, in this case, the central value is taken from the ranges of D to set D≈2.3 nsec.

After creating the layout of the integrated circuit 1020, a clock tree is constructed so that the phase difference D takes the calculated value, thereby providing the integrated circuit 1020 including the interface circuit 500 that can make reliable access to the SDRAM 110 even when the feedback clock is used.

While in this third embodiment the integrated circuit 1020 having the structure shown in FIG. 9 has been described, the structures of the interface circuit 500 and the integrated circuit 1020 are not restricted to those shown in FIG. 9, and this third embodiment is applicable to any device that makes access to an external memory using feedback clocks.

As described above, when the clock phase adjustment method according to the third embodiment is employed, the clock phase can be adjusted by changing the delay value of the clock buffer when designing the layout of a device that makes access with an external memory using a feedback clock, e.g., when performing clock skew adjustment. Therefore, it is possible to create a circuit that can make reliable data access to the external memory, without performing phase adjustment by trial and error like the conventional one, and without performing a test for clock phase adjustment. Especially, even when high-speed access is required like a SDRAM, this third embodiment realizes easy and accurate phase adjustment between an external clock and an internal clock of an integrated circuit capable of high-speed access.

Further, when the integrated circuit design method according to the third embodiment is employed, an integrated circuit can be designed, without performing phase adjustment by trial and error, and without performing a test for clock phase adjustment. Furthermore, since the circuit scale and the number of steps in circuit fabrication are reduced, the power consumption is reduced. Further, since the design is facilitated, the time period for development is reduced. Moreover, since automation is possible, simple mistakes in design are avoided.

Further, according to the third embodiment, an integrated circuit that can supply appropriate clocks without having a complicated circuit like the conventional integrated circuit, is made available. Especially, an integrated circuit including an interface circuit that requires high-speed access, such as a SDRAM, is made available.

Embodiment 4

When an integrated circuit makes access to an external memory using a clock of very high speed, there may be cases where a phase difference D cannot be selected in the structure described for the first embodiment.

For example, the range of phase difference D between the SDCLKO and the TCLK is calculated by formula (6) of condition 1 with the clock cycle being 12.3 nsec (81 MHz) among the parameters shown in Table 1 and Table 2, and the range of phase difference D between the SDCLKO and the ICLK is calculated according to formula (11) of condition 2. Then, condition 1 is represented by $$1-(1.36+1.58+7.79+0.233-0.105)<D<12.3-3-(1.36+1.58+7.79+\\0.233-7.33-0.105)$$

that is, $$-5.28<D<5.772$$

and condition 2 is represented by $$(7.33+0.105+0.233+1.4+2.27)+9-12.3+0.89>D<(7.33+0.015+\\0.233+1.4+2.27)+3-0$$

that is, $$8.928<D<14.338$$

However, where is no value that satisfies both of the ranges of D indicated as the calculation results and, therefore, an appropriate value of D cannot be selected.

In this case, two lines of clocks for capturing data from an external memory are used, and the values of two phase differences D0 and D1 are adjusted to realize a desired circuit.

Figure 11:
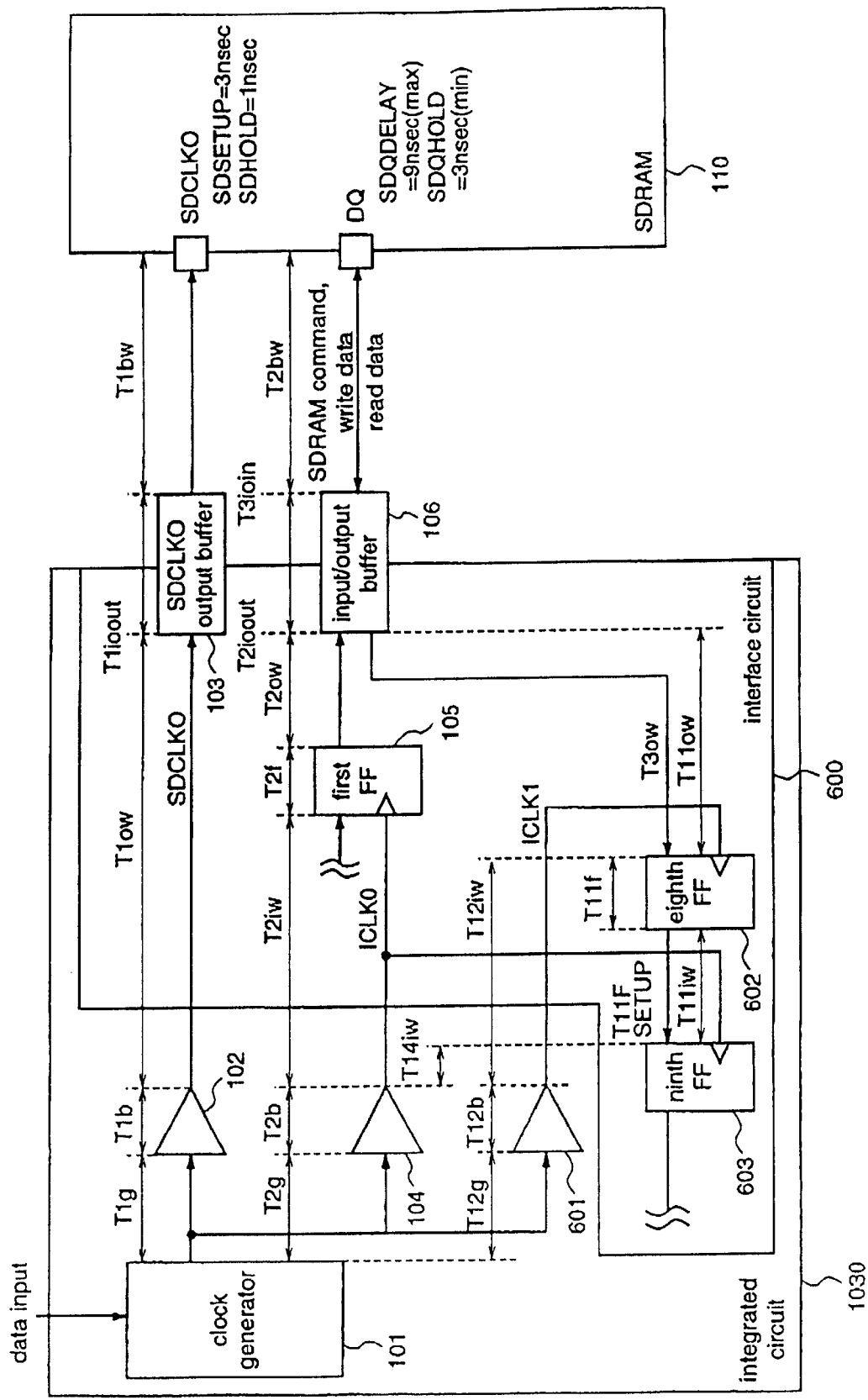
FIG. 11 is a block diagram illustrating the circuit structure of an integrated circuit 1030 according to a fourth embodiment.

FIG. 11 is a block diagram illustrating a part of the structure of an integrated circuit 1030 including an interface circuit 600 that makes data access to an external memory, i.e., a SDRAM 110. In FIG. 11, for the sake of simplicity, a part of the structure of the integrated circuit 1030 relating to access to the SDRAM 110 is schematically shown. The same constituents as those shown in FIG. 1 are given the same reference numerals, and detailed description thereof will be omitted.

The integrated circuit 1030 comprises a clock generator 101, a first clock buffer 102, a second clock buffer 104, a third clock buffer 601, and an interface circuit 600. The interface circuit 600 comprises a SDCLKO output buffer 103, a first flip-flop (first FF) 105 as an output flip-flop, an input/output buffer 106, an eighth flip-flop (eighth FF) 602 as an input flip-flop, and a ninth flip-flop (ninth FF) 510. In the figure, arrows accompanied with parameters starting with T are delay parameters relating to signal transmission in the integrated circuit 1030 and signal transmission between the integrated circuit 1030 and the SDRAM 110.

The eighth FF 602 captures data, which has been read from data stored in the SDRAM 110 by a SDRAM command, through the input/output buffer 106, in synchronization with a clock ICLK1 outputted from the third clock buffer 601.

The ninth FF 603 latched the data captured in the eighth FF 602, with a clock ICLK0 outputted from the second clock buffer 104.

The second clock buffer 104 drives a reference clock, generates an internal clock ICLK0 that operates the inside of the integrated circuit 1030, and supplies the ICLK0 to arbitrary constituents in the integrated circuit 1030. For the sake of simplicity, FIG. 9 shows the case where the ICLK0 is outputted to the first FF 105 and the ninth FF 603.

The third clock buffer 601 drives the reference clock, and generates a clock ICLK1.

Figure 12:
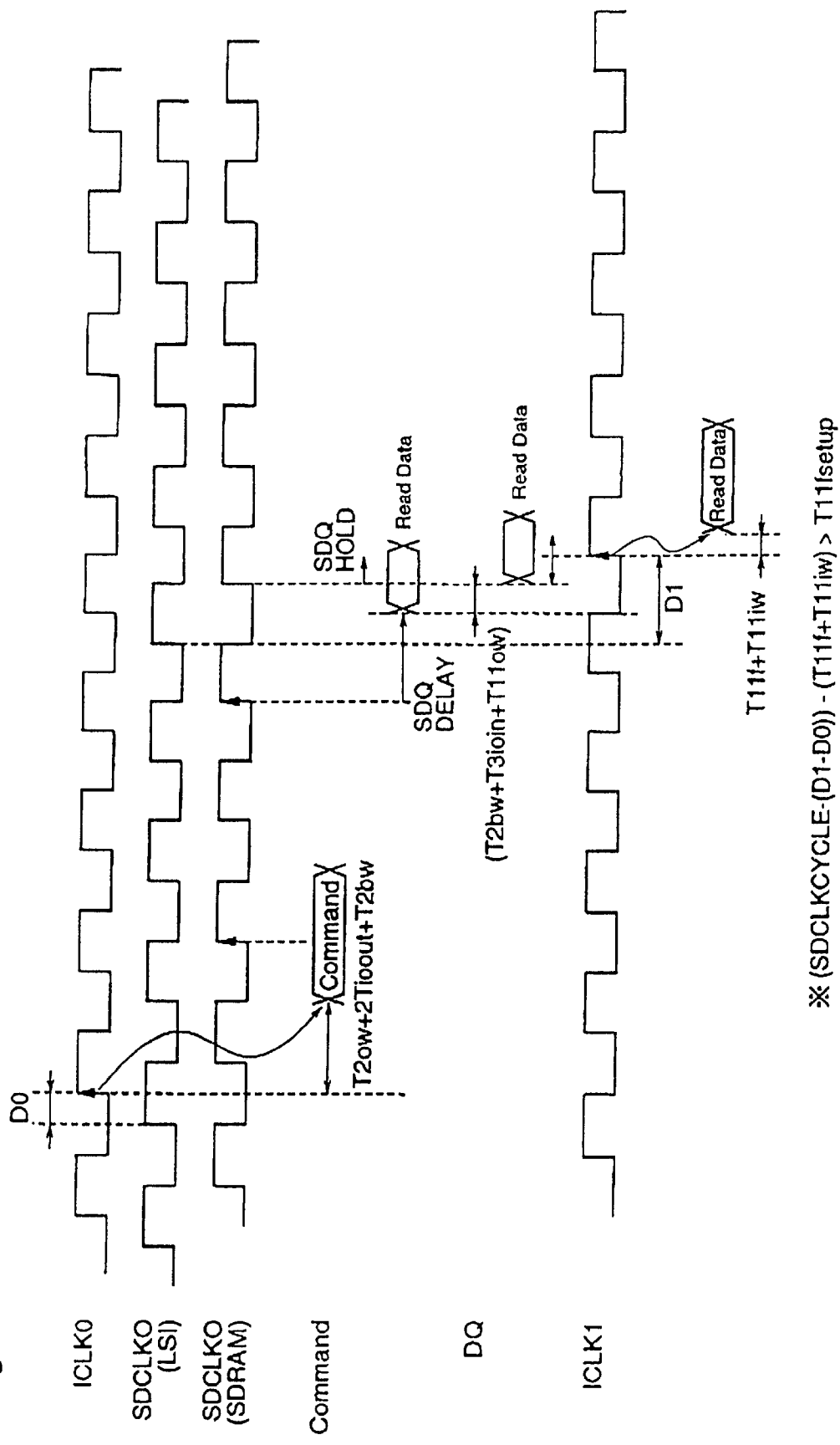
FIG. 12 is a timing chart illustrating the relationship in phases between clocks and data.

FIG. 12 is a timing chart illustrating the relationship in phases between clocks and data when reading data. Hereinafter, the relationship in phases between clocks and data will be described with reference to FIGS. 11 and 12. Since the chart until a SDCLKO signal and a SDRQAM command reach the SDRAM 110 is identical to that shown in FIG. 2, description thereof will be omitted in this fourth embodiment.

D0 is a phase difference between the SDRAM clock SDCLKO (LSI) and the internal clock ICLK0, i.e., a value obtained by subtracting "the time from when the SDCLKO is outputted from the clock generator 101 to when it reaches the SDCLKO output buffer 103" from "the time from when the ICLK0 is outputted from the clock generator 101 to when it reaches the first FF 105".

D1 is a phase difference between the SDCLKO and the internal clock TCLK1, i.e., a value obtained by subtracting "the time from when the SDCLKO is outputted from the clock generator 101 to when it reaches the SDCLKO output buffer 103" from "the time from when the ICLK1 is outputted from the clock generator 101 to when it reaches the eighth FF 602".

The first FF 105 outputs the SDRAM command at the timing of ICLK0, and the command reaches the SDRAM 110 after a period of time indicated by T2$ow$+2T$io$out+T2$bw$.

When reading data out of the SDRAM 110, data reading is started after a period of time indicated by SDQDELAY from when the SDCLKO has reached the SDRAM 110.

The data read from the SDRAM 110 reaches the eighth FF 602 after a period of time indicated by T2$bw$+T3$io$in+T11$ow$. T11$ow$ indicates the wiring delay from the input/output buffer 106 to the eighth FF 602.

Further, the data inputted to the eighth FF 602 reaches the ninth FF 603 when a period of time indicated by T11$f$+T11$iw$ has passed front the rising of the ICLK1. T11$f$ indicates the cell delay of the eighth FF 602, and T11$iw$ indicates the wiring delay from the eighth FF 602 to the ninth FF 603.

Next, a description will be given of a method for calculating please differences D of clocks. D0 and D1 satisfy the following conditions.

Condition 14: D0 satisfies formula (6) of the first embodiment.

Condition 15: D1 satisfies formula (11) of the first embodiment.

Condition 16: Even when the data outputted by the ICLK1 reaches the ninth FF 603 with a delay indicated by (T11$f$+T11$iw$), the data can be captured by the ICLK0. That is, a value obtained by subtracting the delay of data (T11$f$+T11$iw$) from the phase difference between the ICLK1 and the ICLK0 (SDCLKCYCLE−(D1−D0)) should be larger than the setup time of the ninth FF.

Condition 16 is represented as follows.

$$SDCLKCYCLE-(D1-D0)-(T11f+T11iw)>T11FSETUP$$

wherein T11FSETUP indicates the setup time of the ninth FF 603.

Calculation of D that satisfies conditions 14 to 16 will be described taking an example. The values of parameters shown in Table 1 and Table 2 are used, and the clock cycle is changed to 12.3 nsec (81 MHz). Further, parameters of T11$f$, T11$iw$, and T11FSETUP are shown in Table 3.

TABLE 3

| code | MAX | MIN |
|---|---|---|
| T11f | 1.05 | 0.16 |
| T11iw | 0.98 | 0.03 |
| T11FSETUP | 1.03 | 0.58 |

Further, the wiring delay T12$g$ from the clock generator 101 to the third clock buffer 601, the cell delay T12$b$ of the third clock buffer 601, and the wiring delay T12$iw$ from the third clock buffer 601 to the eighth FF 602 are equal to T2$g$, T2$b$, and T2$iw$, respectively; the wiring layer T14$iw$ from the second clock buffer 104 to the ninth FF 603 is equal to T2$iw$; T11$ow$ is equal to T3$ow$; and the setup time and hold time of the eighth FF 602 are equal to T3FSETUP and T3FHOLD, respectively.

Using the above-mentioned parameters, calculation of D that satisfies conditions 14 to 16 is carried out as follows, in like manner as described for the first embodiment.

Under the MAXIMUM condition, calculation is carried out on the assumption that each of the phase differences D0 and D1 is about double what it is at the TYPICAL time.

From condition 14, $$1-(1.36+1.58+7.79+0.233-0.105)<2D0<12.3-3-(1.36+1.58+7.79+0.233-7.33-0.105)-2.14<D0<2.886$$

From condition 15, $$(7.33+0.105+0.233+1.4+2.27)+9-12.3+0.89<2D1<(7.33+0.105+0.233+1.4+2.27)+3-0 \quad 4.464<D1<7.169$$

Under the MINIMUM condition, calculation is carried out on the assumption that the phase difference D is about half what it is at the TYPICAL time.

From condition 14, $$1-(0.17+0+1.24+0.099-1.23-0.105)<<D0/2<12.3-3-(0.17+0+1.24+0.099-1.23-0.105)1.724<D<18.252$$

From condition 15, $$(1.23+0.105+0.099+0.17+0)+9-12.3+0.41<D1/2<(1.23+0.105+0.099+0.17+0)+3-0-2.572<D1<9.208$$

Accordingly, $$1.724<D0<2.886$$

$$4.464<D1<7.169$$

Further, from condition 16, under the MAXIMUM condition, $$2(D1-D0)<9.24$$

$$D1-D0<4.62$$

and, under the MINIMUM condition, $$(D1-D0)/2<11.53$$

$$D1-D0<23.06$$

whereby the range that satisfies the MAXIMUM and MINIMUM conditions of condition 16 is $$D1-D0<4.62$$

Therefore, D0 and D1 that satisfy conditions 14, 15, and 16 are selected as follows.

D0≈2.3 nsec

D1≈5.8 nsec

After creating the layout of the integrated circuit 1030, a clock tree is constructed so that the phase difference D takes the calculated value, thereby providing the integrated circuit 1030 including the interface circuit 600 that can make access to the SDRAM 110.

While in this fourth embodiment the integrated circuit 1030 having the structure shown in FIG. 11 has been described, the structures of the interface circuit 600 and the integrated circuit 1030 are not restricted to those shown in FIG. 11, and this fourth embodiment is applicable to any device that makes access to an external memory using clocks.

As described above, when the clock phase adjustment method according to the fourth embodiment is employed, a device that makes access to an external memory using a higher-speed clock can be designed easily and reliably. Especially, this method is effective when high-speed access is required, like a SDRAM.

While in this fourth embodiment only a single stage of FF, i.e., the eighth FF, is provided before the ninth FF, plural stages of FF may be provided.

Further, while in this fourth embodiment only the third clock buffer 601 for the ICLK1 is employed, plural clock buffers may be used.

Further, this fourth embodiment provides an integrated circuit that performs appropriate data transfer and supplies clocks, without having a complicated circuit in which plural delay elements are inserted in plural signal paths, like the conventional one. Especially, this fourth embodiment facilitates design of a device that requires high-speed access such as a SDRAM. Further, since the interface circuit is provided with the detector for detecting the phase difference between the external clock to be outputted to the external memory and the feedback clock from the external memory, the interface circuit itself can detect the actual delay to adjust the phase difference between the internal clock and the external clock. Accordingly, the optimum clock phase can be adjusted even when there are various external factors such as the wiring delay in the system on which the integrated circuit is mounted, the external load capacity, and the like.

Further, it is possible to automate the design process by incorporating the methods according to the first to fourth embodiments into a CAD system.

Further, while in the first to fourth embodiments T1*bw*, T2*bw*, and T3*bw* are delay data calculated from the board layout, these may be delay values required of the board layout.

While in the first to fourth embodiment calculation is carried out with respect to the data to be outputted from the integrated circuit to the SDRAM, delay values of control signals such as RAS, CAS, and the like are also considered.

Further, the flip-flops included in the interface circuit, the integrated circuit, and the device, which make access to the external memory, are appropriately selected according to the kind of data to be exchanged with the external memory. Accordingly, the number of the output flip-flops or the input flip-flops is not restricted to that described for the first to fourth embodiments, and it is changed according to the interface circuit, integrated circuit, device, or system.

Furthermore, while in the first to fourth embodiments a single SDRAM is connected Lo the integrated circuit, plural external memories may be connected to the integrated circuit. In this case, parameters of each external memory, e.g., the setup time, hold time, and data output delay, are extracted to be applied to the embodiments of the invention.

APPLICABILITY IN INDUSTRY

The present invention is applicable to an integrated circuit that makes data access to an external memory.

What is claimed is:

1. An integrated circuit that makes data access to an external memory in synchronization with a clock, comprising:

a clock generator for generating a clock;

at least one first clock buffer for receiving one of two clocks obtained by branching the clock generated by the clock generator into first and second clocks, and outputting the first clock as an external clock to the external memory;

at least one second clock buffer for receiving the second clock, and outputting the second clock as an internal clock to operate the integrated circuit;

a clock output buffer for outputting the external clock outputted from the first clock buffer, to the external memory;

a data output flip-flop for outputting data to the external memory, in synchronization with the internal clock; and an input flip-flop for capturing data outputted from the external memory, in synchronization with the internal clock;

wherein a value of a phase difference D obtained by subtracting (a) a time from when the external clock is outputted from the clock generator to when it reaches the clock output buffer from (b) a time from when the internal clock is outputted from the clock generator to when it reaches the data output flip-flop is set to satisfy first to fourth conditions as follows:

first condition: a first value obtained by subtracting (c) a time from when the external clock is outputted from the clock generator to when it reaches the external memory from a sum of (b) the time from when the internal clock is outputted from the clock generator to when it reaches the data output flip-flop and (d) a time from when data is outputted from the data output flip-flop by the internal clock that has reached the data output flip-flop, to when the data reaches the external memory is larger than a data hold time of the external memory;

second condition: a value obtained by subtracting the first value from (e) a time corresponding to one cycle of the external clock is larger than data setup time of the external memory;

third condition: a value obtained by subtracting (f) a time from when the internal clock is outputted from the clock generator to when it reaches the input flip-flop from a sum of (c) the time from when the external clock is outputted from the clock generator to when it reaches the external memory and (g) a hold time of data to be outputted from the external memory on receipt of the external clock and (h) a time from when the data is outputted to when it reaches the input flip-flop is larger than a data hold time of the input flip-flop; and fourth condition: a value obtained by subtracting a sum of (c) the time from when the external clock is outputted from the clock generator to when it reaches the external memory and (i) an output delay time of data to be outputted from the external memory on receipt of the external clock and (h) the time from when the data is outputted to when it reaches the input flip-flop from a sum of (j) a time corresponding to one cycle of the internal clock and (k) a time from when the internal clock is outputted from the clock generator to when it reaches the input flip-flop is larger than data setup time of the input flip-flop.

2. An integrated circuit that makes data access to an external memory in synchronization with a clock, comprising:

a clock generator for generating a clock;

at least one first clock buffer for driving the clock generated by the clock generator, as an external clock;

at least one second clock buffer for driving the clock generated by the clock generator, as an internal clock;

a clock output buffer for outputting the external clock to the external memory;

a data output flip-flop for outputting data to the external memory, in synchronization with the internal clock;

a first input flip-flop for latching data outputted from the external memory, by a feedback clock of the external clock inputted to the external memory; and a second input flip-flop for latching the data latched by the first input flip-flop, by the internal clock;

wherein a value of a phase difference D obtained by subtracting (a) a time from when the external clock is outputted from the clock generator to when it reaches the external clock output buffer from (b) a time from when the internal clock is outputted from the clock generator to when it reaches the data output flip-flop is set to satisfy conditions as follows:

a first value obtained by subtracting (c) a time from when the external clock is outputted from the clock generator to when the external clock reaches the external memory from a sum of (d) a time from when the internal clock is outputted from the clock generator to when the internal clock reaches the data output flip-flop and (e) a time from when data is outputted from the data output flip-flop by the internal clock that has arrived at the data output flip-flop, to when the data reaches the external memory is larger than a data hold time of the external memory;

a value obtained by subtracting the first value from (f) a time corresponding to one cycle of the external clock is larger than data setup time of the external memory;

a value obtained by subtracting (g) a time from when the internal clock is outputted from the clock generator to when it reaches a second input flip-flop from a value V obtained by summing (h) a time during which the external clock is outputted from the clock generator to reach the external memory, and returns from the external memory as a feedback clock to reach the first input flip-flop and (i) a cell delay of the first input flip-flop and (j) wiring delay from the first input flip-flop to the second input flip-flop is larger than a hold time of the second input flip-flop;

a value obtained by subtracting the value V from a sum of (g) the time from when the internal clock is outputted from the clock generator to when it reaches the second input flip-flop and (f) the time corresponding to one cycle of the external clock is larger than a setup time of the second input flip-flop;

the value V is larger than (g) the time from when the internal clock is outputted from the clock generator to when it reaches the second input flip-flop; and a value obtained by subtracting (k) time from when the external clock is fed back from the external memory to when it reaches the first input flip-flop from (i) time from when data is outputted from the external memory to when it reaches the first input flip-flop is larger than a hold time of the first input flip-flop.

3. An integrated circuit as defined in claim 2, further comprising:

a phase difference detection circuit wherein plural sets of first phase differences and second phase differences are set in advance, said second phase difference being a phase difference between a time when the external clock is outputted from the integrated circuit and a time when the external clock reaches the integrated circuit by feedback from the external memory, and said first phase difference satisfying the above-mentioned conditions with respect to the second phase differences, and said phase difference detection circuit for detecting an actual second phase difference after the integrated circuit is mounted on an arbitrary system, and then for selecting a first phase difference corresponding to the detected actual second phase difference;

wherein said first and/or second clock buffer comprises delay elements corresponding to the respective first phase differences which have previously been set, and said delay elements are selected on a basis of the first phase difference selected by the phase difference detection circuit.

4. An integrated circuit as defined in claim 1, wherein:

said input flip-flop comprises a first input flip-flop for latching data outputted from the external memory, and a second input flip-flop for latching the data latched by the first input flip-flop; and said second clock buffer comprises a first clock buffer for supplying a first internal clock to the data output flip-flop and to the second input flip-flop, and a second clock buffer for supplying a second internal clock to the first input flip-flop;

wherein a value of a phase difference $D0$ obtained by subtracting (a) the time from when the external clock is outputted from the clock generator to when it reaches the external clock output buffer from (b) the time from when the first internal clock is outputted from the clock generator to when it reaches the data output flip-flop is set to satisfy the first and second conditions; and a phase difference $D1$ obtained by subtracting the time from when the external clock is outputted from the clock generator to when it reaches the external clock output buffer from (l) a time from when the second internal clock is outputted from the clock generator to when it reaches the first input flip-flop, which phase difference $D1$ satisfies the third and fourth conditions, is set so that a value obtained by subtracting (m) a delay of the data inputted to the first input flip-flop until it reaches the second input flip-flop from a phase difference between the phase difference $D0$ and the phase difference $D1$ is larger than a setup time of the second input flip-flop.

5. A clock phase adjustment method when an arbitrary device makes data access to an external memory in synchronization with a clock, comprising:

extracting time parameters relating to transmission of signals in the device and transmission of signals between the device and the external memory, from a layout of the device when designing the device;

calculating, using the parameters, a first phase difference between a of time when an external clock to be supplied to the external memory is outputted and a of time when an internal clock for operating the device reaches a reference point of data input/output;

calculating, using the parameters, a range of the first phase difference which satisfies a condition that the external memory can capture data outputted from the device and the device can capture data outputted from the external memory;

judging whether a calculated first phase difference is within a calculated range of the first phase difference;

ending the process when said judging judges that the calculated first phase difference satisfies the calculated range of the first phase difference, and selecting an arbitrary first phase difference from the calculated range when said judging judges that the calculated first phase difference does not satisfy the range; and changing a value of delay of the external clock signal or the internal clock signal in the device, when designing the device, on a basis of the selected first phase difference.

6. A clock phase adjustment method as defined in claim 5, wherein:

the first phase difference is a value obtained by subtracting (a) a time from when the external clock is outputted from a clock generator in the device to when it reaches an external clock output buffer in the device from (b) a time from when the internal clock is outputted from the clock generator to when it reaches a data output flip-flop in the device; and said calculating the range of the first phase difference comprises the range of the first phase difference that satisfies first to fourth conditions calculated as follows:

first condition: a first value obtained by subtracting (c) a time from when the external clock is outputted from the clock generator to when it reaches the external memory from a sum of (b) the time from when the internal clock is outputted from the clock generator to when it reaches the data output flip-flop and (d) a time from when data is outputted from the data output flip-flop by the internal clock to when the data reaches the external memory is larger than a data hold time that is required for the external memory to capture the data;

second condition: a value obtained by subtracting a first value from (e) a time corresponding to one cycle of the external clock is larger than a data setup time that is required for the external memory to capture the data;

third condition: a value obtained by subtracting (f) a time from when the internal clock is outputted from the clock generator to when it reaches an input flip-flop from a sum of (c) the time from when the external clock is outputted from the clock generator to when it reaches the external memory and (g) a hold time of data to be outputted from the external memory on receipt of the external clock and (h) a time from when the data is outputted to when it reaches the input flip-flop in the device is larger than a data hold time of the input flip-flop; and fourth condition: a value obtained by subtracting a sum of (c) the time from when the external clock is outputted from the clock generator to when it reaches the external memory and (i) a output delay time of data to be outputted from the external memory on receipt of the external clock and (h) the time from when the data is outputted to when it reaches the input flip-flop from a sum of (j) a time corresponding to one cycle of the internal clock and (k) a time from when the internal clock is outputted from the clock generator to when it reaches the input flip-flop is larger than a data setup time of the input flip-flop.

7. A clock phase adjustment method as defined in claim 5, wherein:

the first phase difference is a value obtained by subtracting (a) a time from when the external clock is outputted from a clock generator in the device to when it reaches an external clock output buffer in the device from (b) a time from when the internal clock is outputted from the clock generator to when it reaches a data output flip-flop in the device;

data outputted from the external memory is latched into a first input flip-flop in the device by a clock that is the external clock inputted to the external memory and fed back to the device, and the latched data is latched into a second input flip-flop in the device by the internal clock; and said calculating the range of the first phase difference comprises calculating a range of the first phase difference that satisfies conditions as follows:

a first value obtained by subtracting (c) a time from when the external clock is outputted from the clock generator to when it reaches the external memory from a sum of (b) the time from when the internal clock is outputted from the clock generator to when it reaches the data output flip-flop and (d) a time from when data is outputted from the data output flip-flop by the internal clock to when the data reaches the external memory is larger than a data hold time that is required for the external memory to capture the data;

a value obtained by subtracting the first value from (e) a time corresponding to one cycle of the external clock is larger than a data setup time that is required for the external memory to capture the data;

a value obtained by subtracting (f) a time from when the internal clock is outputted from the clock generator to when it reaches the second input flip-flop from a value V obtained by summing (g) a time during which the external clock is outputted from the clock generator to reach the external memory, and returns from the external memory as a feedback clock to reach the first input flip-flop and (h) a cell delay of the first input flip-flop and (i) a wiring delay from the first input flip-flop to the second input flip-flop is larger than a hold time of the second input flip-flop;

a value obtained by subtracting the value V from a sum of (f) a time from when the internal clock is outputted from the clock generator to when it reaches the second input flip-flop and (e) time corresponding to one cycle of the external clock is larger than a setup time of the second input flip-flop;

the value V is larger than (f) the time from when the internal clock is outputted from the clock generator to when it reaches the second input flip-flop; and a value obtained by subtracting (j) a time from when the external clock is fed back from the external memory to when it reaches the first input flip-flop from (k) a time from when data is outputted from the external memory to when it reaches the first input flip-flop is larger than a hold time of the first input flip-flop.

8. A clock phase adjustment method when an arbitrary device makes data access to an external memory in synchronization with a clock, including:

extracting time parameters relating to transmission of signals in the device and transmission of signals between the device and the external memory, from a layout of the device when designing the device;

calculating, using the parameters, a range of a first phase difference that is obtained by subtracting (a) a time from when the external clock is outputted from a clock generator in the device to when it reaches an external clock output buffer in the device from (b) a time from when the internal clock is outputted from the clock generator to when it reaches a data output flip-flop in the device;

arbitrarily setting a plurality of second phase differences between a of time when the external clock is outputted from the device and a of time when the external clock, which is fed back from the external memory, reaches the device;

setting a first phase difference from the calculated range of a first phase difference, corresponding to each of the plurality of second phase differences;

detecting an actual second phase difference after the device is mounted on an arbitrary system;

comparing the detected actual second phase difference with the set second phase differences, and selecting a corresponding first phase difference; and changing a value of delay of the external clock signal or the internal clock signal in a clock buffer in the device, on the basis of the selected corresponding first phase difference;

wherein data outputted from the external memory is latched into a first input flip-flop in the device by an external clock inputted to the external memory and fed back to the device, and the latched data is latched into a second input flip-flop by the internal clock;

said calculating the range of the first phase difference comprises a range of the first phase difference that satisfies the following conditions calculated as follows:

a first value obtained by subtracting (c) a time from when the external clock is outputted from the clock generator to when it reaches the external memory from a sum of (b) the time from when the internal clock is outputted from the clock generator to when it reaches the data output flip-flop and (d) a time from when data is outputted from the data output flip-flop by the internal clock to when the data reaches the external memory is larger than a data hold time that is required for the external memory to capture the data;

a value obtained by subtracting the first value from (e) a time corresponding to one cycle of the external clock is than the data setup time that is required for the external memory to capture the data;

a value obtained by subtracting (f) a time from when the internal clock is outputted from the clock generator to when it reaches the second input flip-flop from a value V obtained by summing (g) a time during which the external clock is outputted from the clock generator to reach the external memory, and returns from the external memory as a feedback clock to reach the first input flip-flop and (h) a cell delay of the first input flip-flop and (i) a wiring delay from the first input flip-flop to the second input flip-flop is larger than a hold time of the second input flip-flop;

a value obtained by subtracting the value V from a sum of (f) the time from when the internal clock is outputted from the clock generator to when it reaches the second input flip-flop and (j) a time corresponding to one cycle of the external clock is larger than a setup time of the second input flip-flop;

the value V is larger than (f) the time from when the internal clock is outputted from the clock generator to when it reaches the second input flip-flop; and a value obtained by subtracting (j) a time from when the external clock is fed back from the external memory to when it reaches the first input flip-flop from (k) a time from when data is outputted from the external memory to when it reaches the first input flip-flop is larger than a hold time of the first input flip-flop.

9. A clock phase adjustment method as defined in claim 6, wherein:

said device, as the input flip-flop, comprises a first input flip-flop that latches the data outputted from the external memory, and a second input flip-flop that latches the data latched by the first input flip-flop;

said clock generator generates a first internal clock to be supplied to the data output flip-flop and the second input flip-flop, and a second internal clock to be supplied to the first input flip-flop;

said first phase difference includes:

a phase difference D0 obtained by subtracting (a) a time from when the external clock is outputted from the clock generator to when it reaches the external clock output buffer from (b) a time from when the first internal clock is outputted from the clock generator to when it reaches the data output flip-flop, and a phase difference D1 obtained by subtracting (c) a time from when the external clock is outputted from the clock generator to when it reaches the external clock output buffer from (d) a time from when the second internal clock is outputted from the clock generator to when it reaches the first input flip-flop;

calculating the range of the first phase difference includes a step of calculating a range of a phase difference D0 that satisfies the first and second conditions, and a range of the first phase difference D1 that satisfies the third and fourth conditions, and calculates ranges of the phase differences D0 and D1 which satisfy a condition that a value obtained by subtracting (e) a delay of the data inputted to the first input flip-flop until it reaches the second input flip-flop from a phase difference between phase differences D0 and D1 is larger than a setup time of the second input flip-flop; and changing a value of delay of the clock signal includes changing a value of delay of the external clock or the internal clock in the device, using the phase difference between selected phase differences D0 and D1.

10. A method for designing an integrated circuit that makes data access to an external memory in synchronization with a clock, wherein:

said integrated circuit comprises:

a clock generator for generating an internal clock and an external clock;

a data output flip-flop for latching data to be outputted to the external memory;

a first input flip-flop for latching data outputted from the external memory, by a feedback clock of the external clock inputted to the external memory;

a second input flip-flop for latching the data latched by the first input flip-flop, by the internal clock;

a phase difference detection circuit wherein plural sets of first phase differences and second phase differences are set in advance, said first phase difference being a phase difference obtained by subtracting (a) a time from when the external clock is outputted from the clock generator in the integrated circuit to when it reaches an external clock output buffer in the integrated circuit from (b) a time from when the internal clock is outputted from the clock generator to when it reaches a data output flip-flop in the integrated circuit, and said second phase difference being a phase difference between a of time when the external clock is outputted from the integrated circuit and a of time when the external clock reaches the integrated circuit by feedback from the external memory, and said phase difference detection circuit detecting an actual second phase difference after the integrated circuit is mounted on an arbitrary system, and then selecting a first phase difference corresponding to the detected actual second phase difference; and a clock buffer including delay elements corresponding to respective first phase differences that have previously been set, and selecting delay elements on the basis of a first phase difference selected by the phase error detection circuit;

said design method comprises:

extracting time parameters relating to transmission of signals in the device and transmission of signals between the device and the external memory, from a layout of the device when designing the device;

calculating, using the parameters, a range of the first phase differences that satisfy the following conditions:

first condition: a first value obtained by subtracting (c) a time from when the external clock is outputted from the clock generator to when it reaches the external memory from a sum of (b) the time from when the internal clock is outputted from the clock generator to when it reaches the data output flip-flop and (d) a time from when data is outputted from the data output flip-flop by the internal clock to when the data reaches the external memory is larger than a data hold time that is required for the external memory to capture the data;

second condition: a value obtained by subtracting a first value from (e) a time corresponding to one cycle of the external clock is larger than a data setup time that is required for the external memory to capture the data;

third condition: a value obtained by subtracting (f) a time from when the internal clock is outputted from the clock generator to when it reaches the second input flip-flop from a value V obtained by summing (g) a time during which the external clock is outputted from the clock generator to reach the external memory, and returns from the external memory as a feedback clock to reach the first input flip-flop and (h) a cell delay of the first input flip-flop and (i) a wiring delay from the first input flip-flop to the second input flip-flop is larger than a hold time of the second input flip-flop;

fourth condition: a value obtained by subtracting the value V from a sum of (j) a time from when the internal clock is outputted from the clock generator to when it reaches the second input flip-flop and (k) a time corresponding to one cycle of the external clock is larger than a setup time of the second input flip-flop;

fifth condition: the value V is larger than (j) the time from when the internal clock is outputted from the clock generator to when it reaches the second input flip-flop; and sixth condition: a value obtained by subtracting (h) the time from when the external clock is fed back from the external memory to when it reaches the first input flip-flop from (l) a time from when data is outputted from the external memory to when it reaches the first input flip-flop is larger than a hold time of the first input flip-flop; and arbitrarily setting a plurality of second phase differences;

setting a first phase difference that satisfies the first through sixth conditions, corresponding to each of the plural second phase differences; and setting a value of delay of the external clock or the internal clock in the integrated circuit, corresponding to each of calculated first phase differences.

* * * * *

UNITED STATES PATENT AND TRADEMARK OFFICE
CERTIFICATE OF CORRECTION

PATENT NO. : 6,556,505 B1
DATED : April 29, 2003
INVENTOR(S) : Masayoshi Tojima et al.

It is certified that error appears in the above-identified patent and that said Letters Patent is hereby corrected as shown below:

<u>Column 36,</u>
Lien 66, delete "of".

<u>Column 39,</u>
Lines 12 and 13, delete "of".

<u>Column 41,</u>
Lines 9 and 11, delete "of".

Signed and Sealed this

Twenty-seventh Day of January, 2004

JON W. DUDAS
*Acting Director of the United States Patent and Trademark Office*